United States Patent
Shin et al.

(10) Patent No.: US 10,811,077 B2
(45) Date of Patent: Oct. 20, 2020

(54) REFRESH CONTROL CIRCUIT, MEMORY DEVICE INCLUDING THE SAME AND METHOD OF OPERATING THE SAME FOR HAMMER REFRESH OPERATION

(71) Applicant: SAMSUNG ELECTRONICS CO., LTD., Suwon-si, Gyeonggi-do (KR)

(72) Inventors: Hoon Shin, Hwaseong-si (KR); Do-Yeon Kim, Seoul (KR); Ho-Young Song, Hwaseong-si (KR); Dong-Su Lee, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 16/235,638

(22) Filed: Dec. 28, 2018

(65) Prior Publication Data
US 2019/0348107 A1 Nov. 14, 2019

(30) Foreign Application Priority Data
May 14, 2018 (KR) .................. 10-2018-0054686

(51) Int. Cl.
 *G11C 11/406* (2006.01)
(52) U.S. Cl.
 CPC .. *G11C 11/40618* (2013.01); *G11C 11/40603* (2013.01)
(58) Field of Classification Search
 CPC .................. G11C 11/40618; G11C 11/40603
 See application file for complete search history.

(56) References Cited

U.S. PATENT DOCUMENTS

| | | | |
|---|---|---|---|
| 9,032,141 B2 | 5/2015 | Bains et al. | |
| 9,318,185 B2 | 4/2016 | Kim et al. | |
| 9,384,821 B2 | 7/2016 | Bains et al. | |
| 9,431,085 B2 | 8/2016 | Greenberg et al. | |
| 9,478,316 B1 | 10/2016 | Ryu | |
| 9,570,143 B2 | 2/2017 | Lim et al. | |
| 9,690,505 B2 | 6/2017 | Benedict | |
| 9,721,643 B2 | 8/2017 | Bains et al. | |
| 9,892,779 B2 * | 2/2018 | Kang | G06F 3/0619 |
| 9,972,377 B2 * | 5/2018 | Oh | G11C 11/40615 |
| 10,020,046 B1 * | 7/2018 | Uemura | G11C 11/4091 |
| 2015/0262652 A1 | 9/2015 | Igarashi | |
| 2017/0011792 A1 * | 1/2017 | Oh | G11C 11/40622 |
| 2017/0117030 A1 | 4/2017 | Fisch et al. | |

(Continued)

FOREIGN PATENT DOCUMENTS

KR 10-1731508 B1 5/2017

*Primary Examiner* — Tri M Hoang
(74) *Attorney, Agent, or Firm* — Lee IP Law, PC

(57) ABSTRACT

A memory device a plurality of memory banks, a hammer address manager, and a refresh controller. The hammer address manager manages access addresses with respect to the plurality of memory banks and provides a hammer address for a hammer refresh operation among the access addresses, the hammer address being the access address that is accessed more than other access addresses. The refresh controller generates a hammer refresh address signal based on the hammer address, the hammer refresh address signal corresponding to a row that is physically adjacent to a row corresponding to the hammer address such that the row physically adjacent to the row corresponding to the hammer address is refreshed by the hammer refresh operation.

20 Claims, 28 Drawing Sheets

(56) References Cited

U.S. PATENT DOCUMENTS

| 2017/0186481 | A1* | 6/2017 | Oh ................... G11C 11/40615 |
| 2017/0213586 | A1* | 7/2017 | Kang ................... G06F 3/0619 |
| 2017/0365324 | A1 | 12/2017 | Bains et al. |
| 2018/0158507 | A1* | 6/2018 | Bang ................. G11C 11/40603 |
| 2018/0315469 | A1* | 11/2018 | Uemura ............. G11C 11/4093 |

* cited by examiner

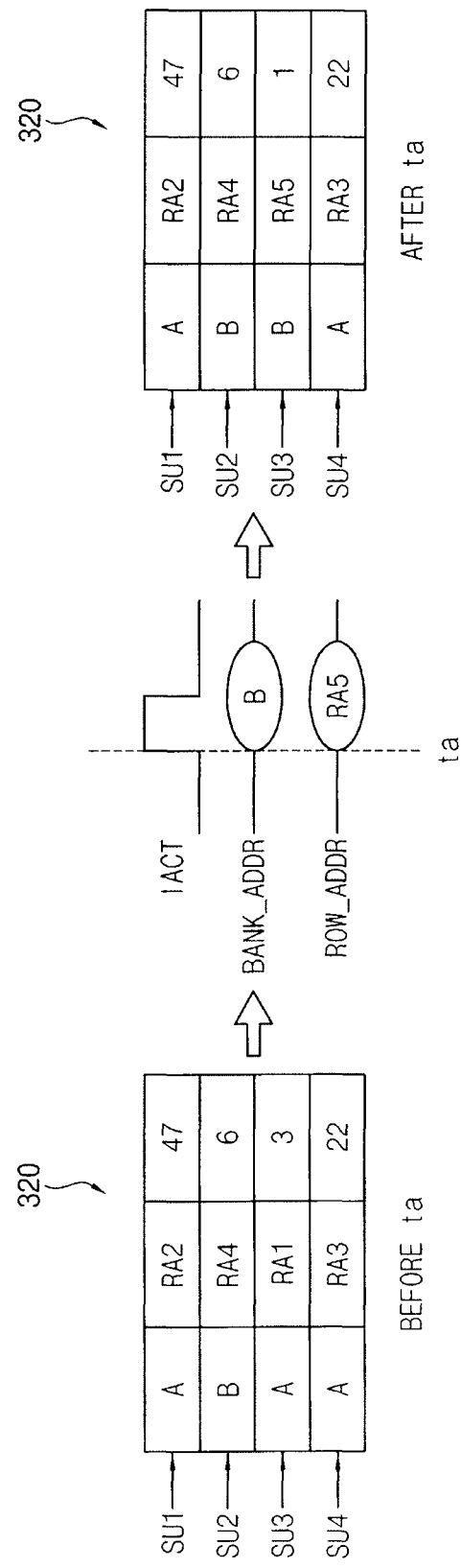

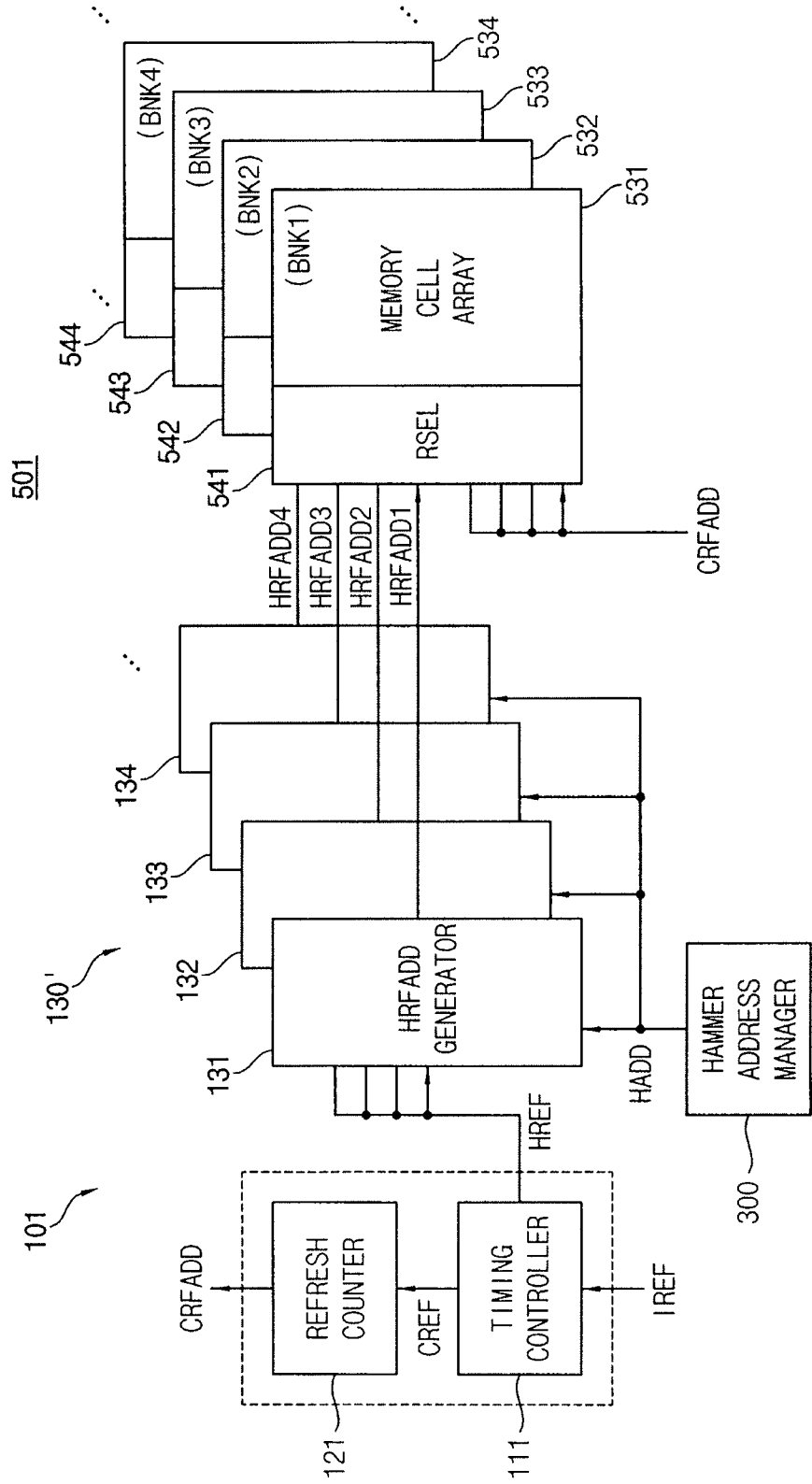

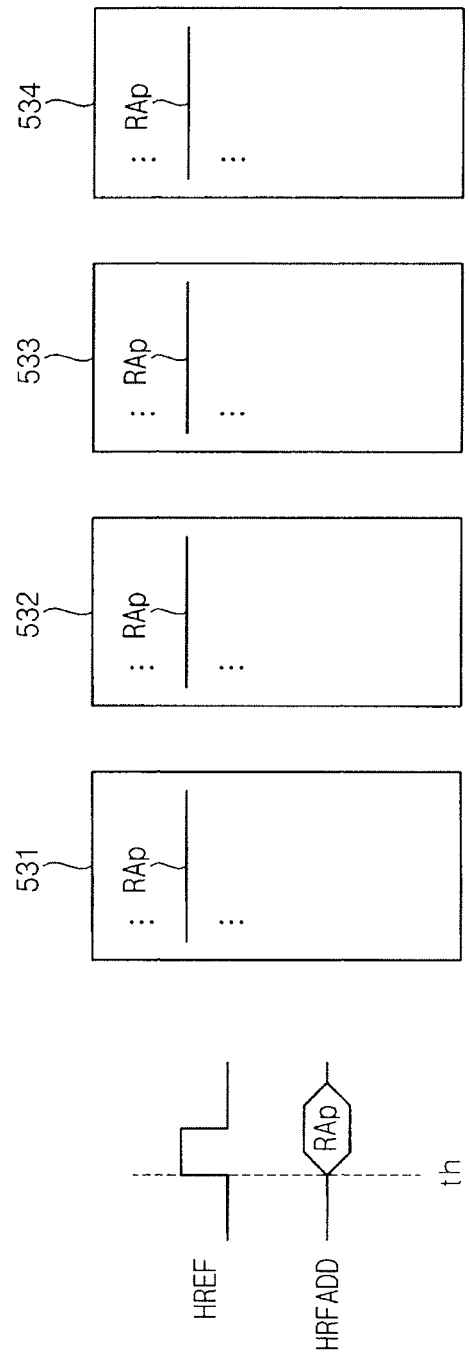

ent of a hammer address manager included in the memory
REFRESH CONTROL CIRCUIT, MEMORY DEVICE INCLUDING THE SAME AND METHOD OF OPERATING THE SAME FOR HAMMER REFRESH OPERATION

CROSS-REFERENCE TO RELATED APPLICATION

Korean Patent Application No. 10-2018-0054686, filed on May 14, 2018, in the Korean Intellectual Property Office (KIPO), and entitled: "Refresh Control Circuit, Memory Device Including the Same and Method of Operating the Same for Hammer Refresh Operation," is incorporated by reference herein in its entirety.

BACKGROUND

1. Field

Example embodiments relate generally to semiconductor integrated circuits, and more particularly to a refresh control circuit, a memory device including a refresh control circuit and a method of operating a memory device for a hammer refresh operation.

2. Discussion of the Related Art

Semiconductor memory devices for storing data may be classified into volatile memory devices and non-volatile memory devices. Volatile memory devices, such as dynamic random access memory (DRAM) devices, store data by charging or discharging capacitors in memory cells, and lose the stored data when power is off. Non-volatile memory devices, such as flash memory devices, maintain stored data even when power is off. Volatile memory devices are widely used as main memories of various apparatuses, and non-volatile memory devices are widely used for storing program code and/or data in various electronic devices, e.g., computers, mobile devices, etc.

In volatile memory devices, cell charges stored in a memory cell may be lost due to a leakage current. In addition, when a wordline is transitioned frequently between an active state and a precharged state (e.g., when the wordline has been accessed intensively or frequently), a memory cell connected to a wordline that is adjacent to the frequently accessed wordline may be affected and lose stored charges, potentially causing data loss. Charges stored in a memory cell may be maintained by recharging before data is lost due to leakage of the charges. Such recharge of cell charges is referred to as a refresh operation, and a refresh operation may be performed repeatedly before cell charges are significantly lost.

SUMMARY

According to example embodiments, a memory device includes a plurality of memory banks, a hammer address manager and a refresh controller. The hammer address manager manages access addresses with respect to the plurality of memory banks and provides a hammer address for a hammer refresh operation among the access addresses, where the hammer address is the access address that is accessed more than other access addresses. The refresh controller generates a hammer refresh address signal based on the hammer address, where the hammer refresh address signal represents a row that is physically adjacent to a row corresponding to the hammer address such that the row is refreshed by the hammer refresh operation.

According to example embodiments, a refresh control circuit includes an access storage, a storage controller and a refresh controller. The access storage stores the access addresses with respect to a plurality of memory banks included in a memory device and access count values, where each access count value represents an access number of each access address, and the access storage is shared by the plurality of memory banks. The storage controller controls the access storage based on an access address signal provided from a memory controller and provides the hammer address among the access addresses based on the access addresses and the access count values stored in the access storage. The refresh controller generates a hammer refresh address signal based on the hammer address, where the hammer refresh address signal represents a row that is physically adjacent to a row corresponding to the hammer address such that the row is refreshed by the hammer refresh operation.

According to example embodiments, a method of operating a memory device includes managing access addresses with respect to a plurality of memory banks using an access storage that is shared by the plurality of memory banks, providing a hammer address for a hammer refresh operation among the access addresses where the hammer address is an address that is accessed more than other access addresses, and generating a hammer refresh address signal based on the hammer address where the hammer refresh address signal represents a row that is physically adjacent to a row corresponding to the hammer address such that the row is refreshed by the hammer refresh operation.

BRIEF DESCRIPTION OF THE DRAWINGS

Features will become apparent to those of skill in the art by describing in detail exemplary embodiments with reference to the attached drawings in which:

FIGS. 8A through 8D illustrate diagrams for describing example embodiments of access counting by the hammer address manager of FIG. 4.

FIG. 10 illustrates a block diagram of a memory device according to example embodiments.

FIGS. 16A and 16B illustrate diagrams for describing an operation of a memory device according to example embodiments.

DETAILED DESCRIPTION

Figure 1:
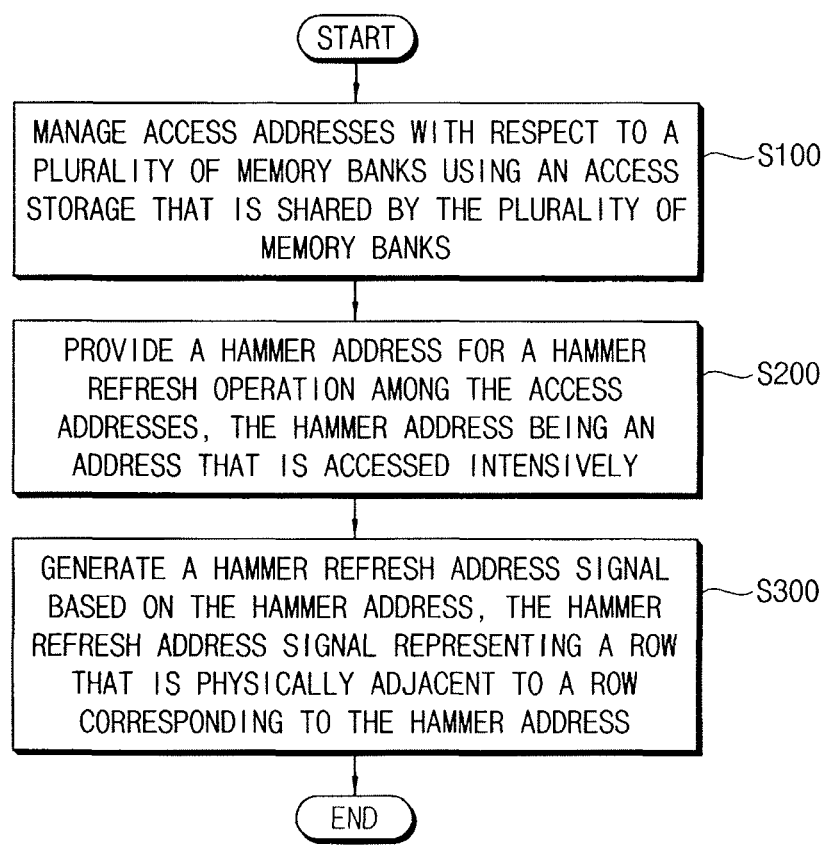
FIG. 1 illustrates a flow chart of a method of operating a memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of operating a memory device according to example embodiments.

Referring to FIG. 1, access addresses with respect to a plurality of memory banks are managed synthetically using an access storage that is shared by the plurality of memory banks (S100). Each of the synthetically managed access addresses may include one bank address and one row address. In other words, each access address may correspond to a combination of a bank address and a row address. Example embodiments of the access storage will be described below with reference to FIG. 5 and example embodiments of managing the access addresses will be described below with reference to FIGS. 8A through 8D.

A hammer address for a hammer refresh operation is provided among the access addresses, where the hammer address is an address, e.g., a row, that is accessed intensively (S200). The hammer address will be further described below with reference to FIG. 7 and example embodiments of providing the hammer address will be described with reference to FIGS. 9A through 9C.

A hammer refresh address signal is generated based on the hammer address, where the hammer refresh address signal represents a row that is physically adjacent to a row corresponding to the hammer address (S300), e.g., a victim row. Frequent row activations, e.g., read operations, may result in voltage fluctuations in corresponding wordlines, e.g., row activation lines, such that higher discharge rates of capacitors in victim rows may occur. Example embodiments of generating the hammer refresh address signal and the hammer refresh operation will be described below with reference to FIGS. 10 through 11C.

A volatile memory device such as a dynamic random access memory (DRAM) performs a refresh operation periodically due to charge leakage of memory cells storing data. Due to scale down of the manufacturing process of the DRAM, the storage capacitance of the memory cell is decreased and the refresh period is shortened. When memory capacity of the DRAM is increased, the refresh period is further shortened because the entire refresh time is increased.

To compensate for degradation of adjacent memory cells due to the intensive access of a particular row or a hammer address, a target row refresh (TRR) scheme may be adopted and an in-memory refresh scheme may be used to reduce the burden of the memory controller. The memory controller is totally responsible for the hammer refresh operation in the TRR scheme and the memory device is totally responsible for the hammer refresh operation in the in-memory refresh scheme. The chip size overhead for the in-memory refresh operation may be large as the memory capacity is increased and demands on low power consumption of the memory device is increased.

The refresh control circuit, the memory device and the method of operating a memory device according to example embodiments may decrease an occupation area of resources for the hammer refresh operation and enhance efficiency of the hammer refresh operation by managing the access addresses synthetically with respect to the plurality of memory banks using the access storage shared by the plurality of memory banks.

Figure 2:
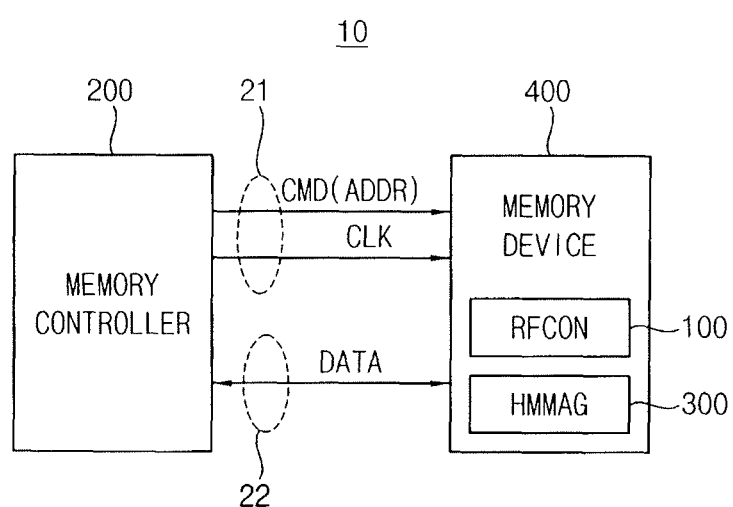
FIG. 2 illustrates a block diagram of a memory system according to example embodiments.
Figure 3:
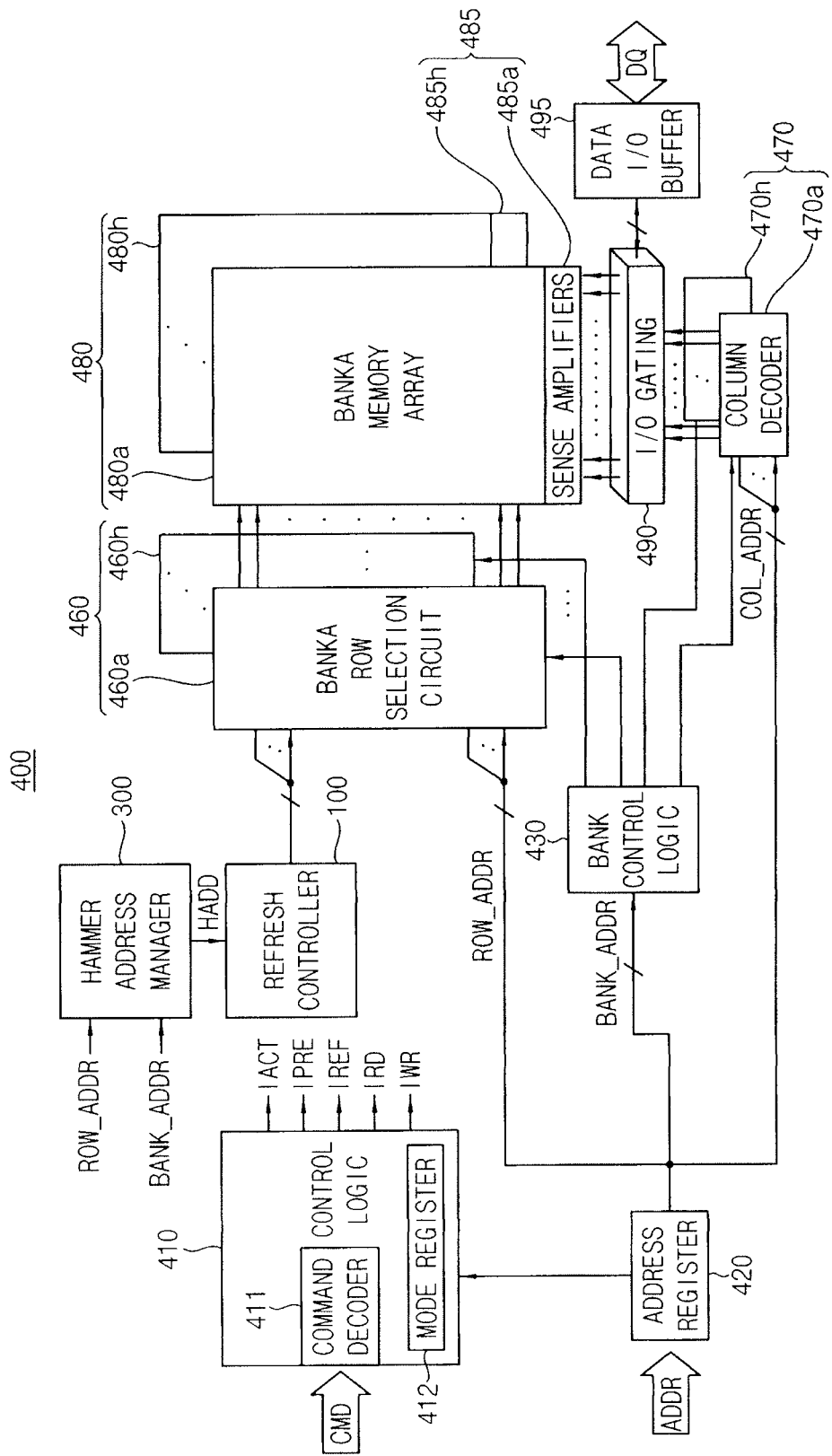
FIG. 3 illustrates a block diagram of a memory device according to example embodiments.

FIG. 2 is a block diagram illustrating a memory system according to example embodiments. FIG. 3 is a block diagram illustrating a memory device according to example embodiments.

Referring to FIG. 2, a memory system 10 includes a memory controller 200 and a memory device 400. The memory controller 200 and the memory device 400 include respective interfaces for mutual communication. The interfaces may be connected through a control bus 21 for transferring a command CMD, an address ADDR, a clock signal CLK, etc. and a data bus 22 for transferring data. According to some standards for memory devices, the address ADDR may be incorporated in the command CMD. The memory controller 200 may generate the command CMD to control the memory device 400 and the data may be written to or read from the memory device 400 under the control of the memory controller 200.

According to example embodiments, the memory device 400 may include a refresh controller RFCON 100 and a hammer address manager HMMAG 300. The hammer address manager 300 may manage access addresses synthetically with respect to a plurality of memory banks of the memory device 400 and provide a hammer address for a hammer refresh operation among the access addresses, where the hammer address is an address that is accessed intensively. The refresh controller 100 may generate a hammer refresh address signal based on the hammer address, where the hammer refresh address signal represents a row that is physically adjacent to a row corresponding to the hammer address, e.g., a victim row.

Referring to FIG. 3, the memory device 400 may include a control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, refresh controller 100 and a hammer address manager 300. As used herein, a "unit" may refer to a "circuit."

The memory cell array 480 may include a plurality of bank arrays 480a~480h. The row selection circuit 460 may include a plurality of bank row selection circuits 460a~460h respectively coupled to the bank arrays 480a~480h. The column decoder 470 may include a plurality of bank column decoders 470a~470h respectively coupled to the bank arrays 480a~480h. The sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a~460h corresponding to the bank address BANK_ADDR may be activated in response to the bank control signals, and one of the bank column decoders 470a~470h corresponding to the bank address BANK_ADDR may be activated in response to the bank control signals.

The row address ROW_ADDR from the address register 420 may be applied to the bank row selection circuits 460a~460h. The activated one of the bank row selection circuits 460a~460h may decode the row address ROW_ADDR, and may activate a wordline corresponding to the row address ROW_ADDR. For example, the activated bank row selection circuit may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some embodiments, in a burst mode, the column address latch may generate column addresses that increment from the received column address COL_ADDR. The column address latch may apply the temporarily stored or generated column address to the bank column decoders 470a~470h.

The activated one of the bank column decoders 470a~470h may decode the column address COL_ADDR and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~485h coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 in order to perform a write operation, a read operation, or a refresh operation. The control logic 410 may generate internal command signals such as an active signal TACT, a precharge signal IPRE, a refresh signal IREF, a read signal IRD, a write signal IWR, etc. based on commands CMD transferred from the memory controller 200 in FIG. 2. The control logic 410 may include a command decoder 411 that decodes the commands CMD received from the memory controller 200 and a mode register set 412 that sets an operation mode of the memory device 400.

Although FIG. 3 illustrates the control logic 410 and the address register 420 that are distinct from each other, the control logic 410 and the address register 420 may be implemented as a single inseparable circuit. In addition, although FIG. 3 illustrates the command CMD and the address ADDR are provided as distinct signals, the command CMD and the address ADDR may be provided as a combined signals as specified by LPDDR5 standards.

The hammer address manager 300 may manage access addresses synthetically with respect to the plurality of bank arrays 480a~480h based on the bank address BANK_ADDR and the row address ROW_ADDR, and may provide a hammer address HADD for a hammer refresh operation among the access addresses, where the hammer address HADD is an address that is accessed intensively. The refresh controller 100 may generate a hammer refresh address signal based on the hammer address HADD, where the hammer refresh address signal represents a row that is physically adjacent to a row corresponding to the hammer address HADD, e.g., a victim row.

Figure 4:
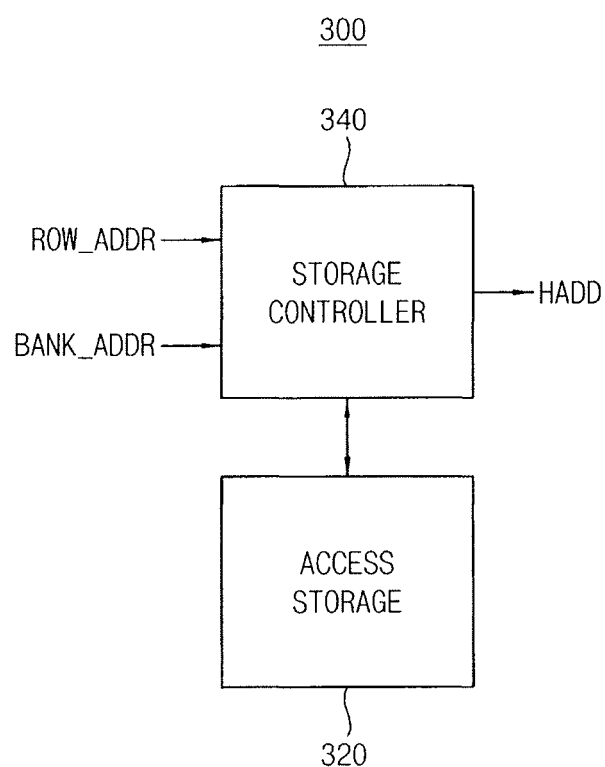
FIG. 4 illustrates a block diagram of an example embodiment of a hammer address manager included in the memory device of FIG. 3.
Figure 5:
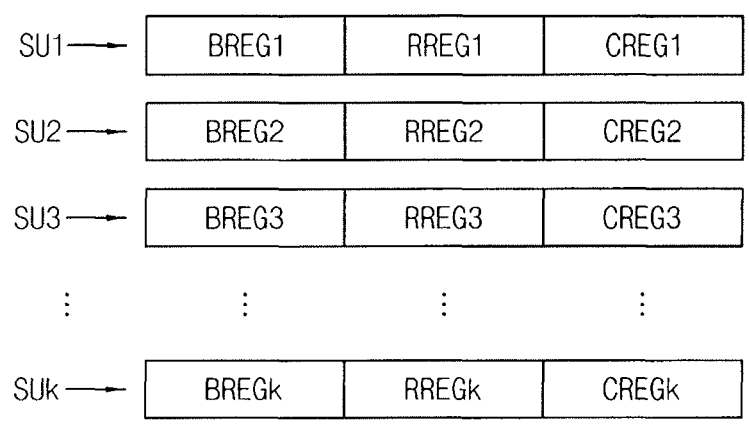
FIG. 5 illustrates a diagram of an example embodiment of an access storage included in the hammer address manager of FIG. 4.

FIG. 4 is a block diagram illustrating an example embodiment of a hammer address manager included in the memory device of FIG. 3. FIG. 5 is a diagram illustrating an example embodiment of an access storage included in the hammer address manager of FIG. 4.

Referring to FIG. 4, the hammer address manager 300 may include an access storage 320 and a storage controller 340.

The access storage 320 may store information with respect to the hammer address HADD that is accessed intensively or frequently. In some example embodiments, the access storage 320 may include a plurality of storage units SU1~SUk as illustrated in FIG. 5. Each storage unit SUi (i=1~k) may include a bank register BREGi to store the bank address of each access address, a row register RREGi to store the row address of each access address, and a count register CREGi to store each access count value.

The storage controller 340 may control the access storage 320 based on an access address signal BANK_ADDR and ROW_ADDR that is transferred from the memory controller 200 to the memory device 400. The access address may include a bank address signal BADD_ADDR and a row address signal ROW_ADDR. The storage controller 340 may determine and provide the hammer address HADD among the stored access addresses based on the access count values. The management scheme of the hammer address HADD used by the storage controller 340 may be determined variously depending on the memory system.

Figure 6:
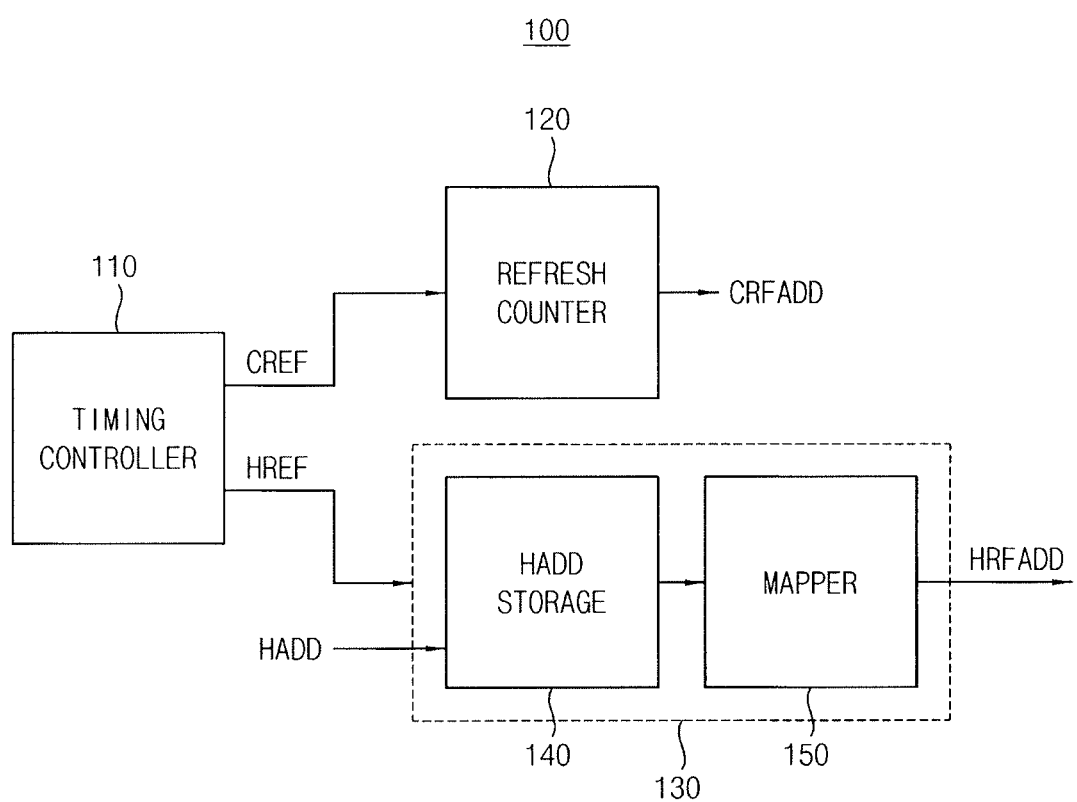
FIG. 6 illustrates a block diagram of a refresh controller included in the memory device of FIG. 3.

FIG. 6 is a block diagram illustrating a refresh controller included in the memory device of FIG. 3. Referring to FIG. 6, the refresh controller 100 may include a timing controller 110, a refresh counter 120, and an address generator 130.

The timing controller 110 may generate a counter refresh signal CREF representing a timing of a normal refresh operation and a hammer refresh signal HREF representing a timing of a hammer refresh operation based on operational characteristics of the memory device 400. As will be described below with reference to FIGS. 11A, 11B, and 11C, the timing controller 110 may selectively activate one of the counter refresh signal CREF and the hammer refresh signal HREF. In some example embodiments, as illustrated in FIG. 6, the timing controller 110 may be included in the refresh controller 100. The timing controller 110 may be omitted, and the counter refresh signal CREF and the hammer refresh signal HREF may be provided from other control logics in the memory device 400.

The refresh counter 120 may generate a counter refresh address signal CRFADD in response to the counter refresh signal CREF where the counter refresh address signal CRFADD may represent a sequentially changing address. For example, the refresh counter 120 may increase a value of the counter refresh address signal CRFADD whenever the counter refresh signal CREF is activated. Wordlines in a memory cell array of the memory device 400 may be selected sequentially for refresh operations by increasing the value of the counter refresh address signal CRFADD.

The address generator 130 may store the hammer address HADD provided from the hammer address manager 300 and may generate a hammer refresh address signal HRFADD in synchronization with the hammer refresh signal HREF, where the hammer refresh address signal HRFADD represents an address of a row that is physically adjacent to the row corresponding to the hammer address HADD. The address generator 130 may include a hammer address storage 140 and a mapper 150.

The hammer address storage 140 may store the hammer address HADD provided from hammer address manager 300. The mapper 150 may generate the hammer refresh address signal HRFADD based on the hammer address HADD provided from the hammer address storage 140. According to example embodiments, the hammer address storage 140 may be omitted and the mapper 150 may receive the hammer address HADD directly from the hammer address manager 300. As will be described below with reference to FIG. 7, the hammer refresh address signal HRFADD may indicate an address of the row of the memory device 400 that is physically adjacent to the row of the memory device 400 corresponding to the hammer address HADD. In some example embodiments, the mapper 150 may provide an address corresponding to one of the two adjacent rows in response to the hammer refresh signal HREF as will be described below with reference to FIGS. 11A and 11B. In other example embodiments, the mapper 150 may sequentially provide addresses corresponding to the two adjacent rows in response to the hammer refresh signal HREF as will be described below with reference to FIG. 11C. In still other example embodiments, the mapper 150 may provide an address corresponding to one of the four adjacent rows or sequentially provide addresses corresponding to the four adjacent rows in response to the hammer refresh signal HREF.

Figure 7:
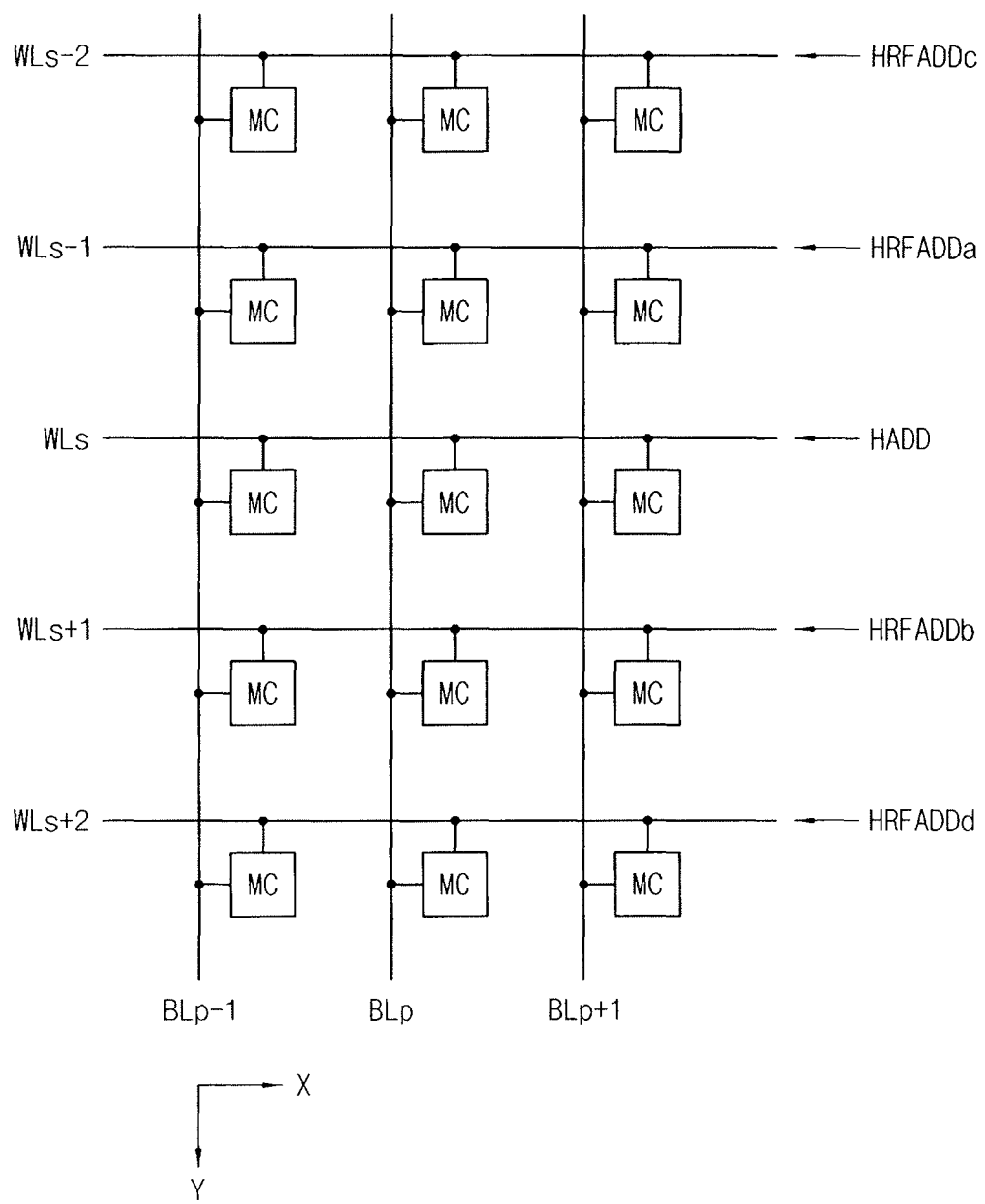
FIG. 7 illustrates a diagram of a portion of a memory cell array for describing a data loss due to wordline coupling.

FIG. 7 is a diagram illustrating a portion of a memory cell array for describing a data loss due to wordline coupling. FIG. 7 illustrates five wordlines WLs−2, WLs−1, WLs, WLs+1 and WLs+2, three bitlines BLp−1, BLp and BLp+1 and memory cells MC coupled to the wordlines WLs−2, WLs−1, WLs, WLs+1 and WLs+2 and the bitlines BLp−1, BLp and BLp+1 in the memory cell array. The five wordlines WLs−2, WLs−1, WLs, WLs+1 and WLs+2 extend in a row direction (e.g., X direction) and are arranged sequentially along a column direction (e.g., Y direction). The three bitlines BLp−1, BLp and BLp+1 extend in the column direction and are arranged sequentially along the row direction.

For example, the middle wordline WLs may correspond to the hammer address HADD that has been accessed intensively. It will be understood that an intensively-accessed or hammer wordline refers to a wordline that has a relatively higher activation number and/or has a relatively higher activation frequency (e.g., greater than a predetermined threshold or greater than other access addresses). Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−2, WLs−1. WLs+1 and WLs+2 to fluctuate as the voltage level of the hammer wordline WLs varies. Thus, the cell charges of the memory cells MC coupled to the adjacent wordlines WLs−2, WLs−1, WLs+1 and WLs+2 are affected. As the hammer wordline WLs is accessed more frequently, the cell charges of the memory cells MC coupled to the adjacent wordlines WLs−2, WLs−1, WLs+1, and WLs+2 may be lost more rapidly.

The address generator 130 in FIG. 5 may provide the hammer refresh address signal HRFADD representing addresses HRFADDa, HRFADDb, HRFADDc and HRFADDd of the rows (e.g., the wordlines WLs−1, WLs+1, WLs−2, and WLs+2) that are physically adjacent to the row of the hammer address HADD (e.g., the middle wordline WLs), and a hammer refresh operation for the adjacent wordlines WLs−1, WLs+1, WLs−2, and WLs+2 may be performed based on (e.g., in response to) the hammer refresh address signal HRFADD to reduce or possibly prevent the loss of data stored in the memory cells MC. The hammer refresh operation may be performed with respect to the two wordlines WLs−1 and WLs+1 directly adjacent to the hammer wordline WLs or with respect to the four wordlines WLs−2, WLs−1, WLs+1 and WLs+2 including the next adjacent wordlines WLs−2 and WLs+2.

Hereinafter, example embodiments of managing the access addresses for the hammer refresh operation and providing the hammer address are described with reference to FIGS. 8A through 9C. FIGS. 8A through 9C are provided as an example for describing the synthetic management of the access addresses with respect to a plurality of memory banks, and the specific operation scenario may be implemented variously.

FIGS. 8A through 8D are diagrams for describing example embodiments of access counting by the hammer address manager of FIG. 4. Even though FIGS. 8A through 8D illustrate an example that the access storage 320 includes four storage units SU1, SU2, SU3, and SU4 for convenience of illustration and description, the number of the storage units may be changed variously. FIGS. 8A through 8D illustrate a bank address of a bank address signal BANK_ADDR, a row address of a row address signal ROW_ADDR, and an access count value at an activation time point ta of an active signal IACT indicating a reception time of an active command provided from a memory controller, and the states of the access storage 320 before and after the activation time point ta of the active signal IACT.

Figure 8A:
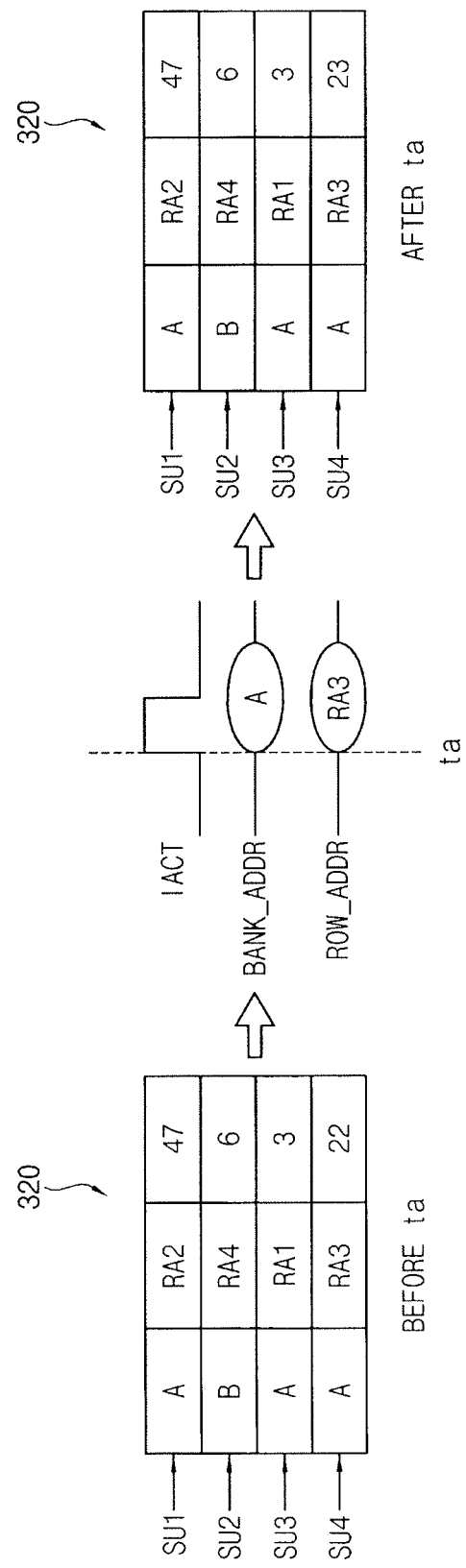

Referring to FIGS. 4 and 8A, when an input access address (A and RA3), that is a combination of a bank address A and a row address RA3 provided through the address signals BANK_ADDR and ROW_ADDR, corresponds to one of access addresses (A, RA2), (B, RA4), (A, RA1), and (A, RA3) stored in the access storage 320, the storage controller 340 may increase an access count value corresponding to the input access address (A, RA3) by one from 22 to 23. As such, the hammer address manager 300 may accumulate the access count values.

Figure 8B:
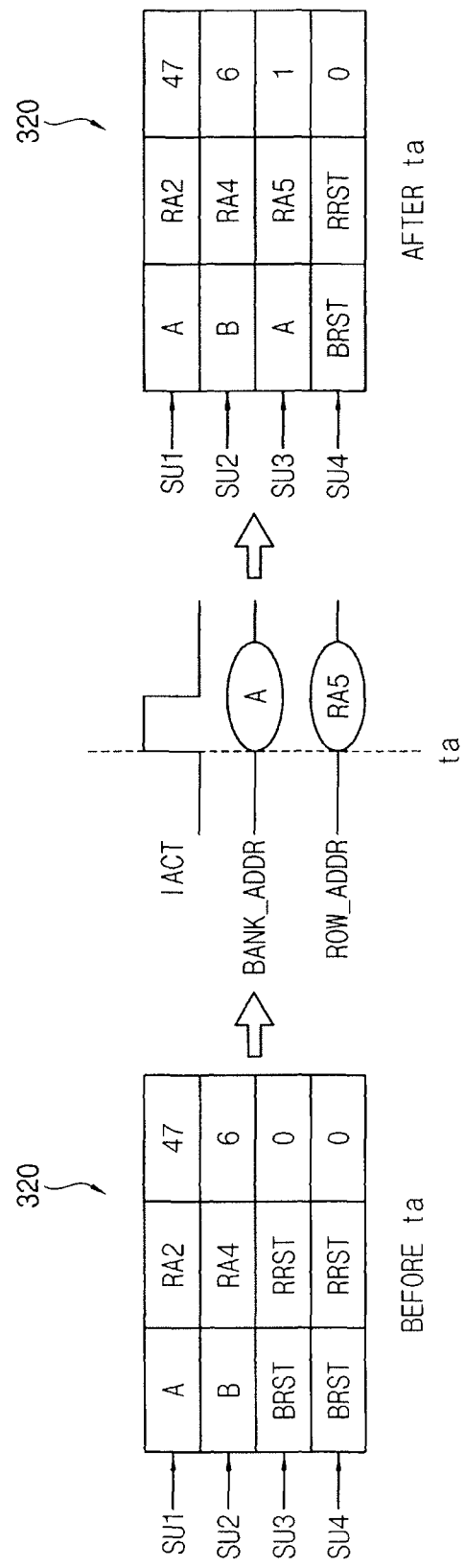

Referring to FIGS. 4 and 8B, when an input access address (A and RA5) provided through the address signals BANK_ADDR and ROW_ADDR does not correspond to one of access addresses (A, RA2) and (B, RA4) stored in the access storage 320 and some storage units (e.g., SU3 and SU4) have been initialized to a reset bank address BRST and a reset row address RRST, the storage controller 340 may store the input access address (A, RA5) and corresponding access count value in one storage value (e.g., SU3) that has been initialized. For example, the reset addresses BRST and RRST may correspond to a predetermined value such as "0000", "1111", etc. When the reset addresses BRST and RRST are stored in the storage unit, the storage unit may be regarded as an unoccupied space in which a valid address is not stored.

Figure 8C:
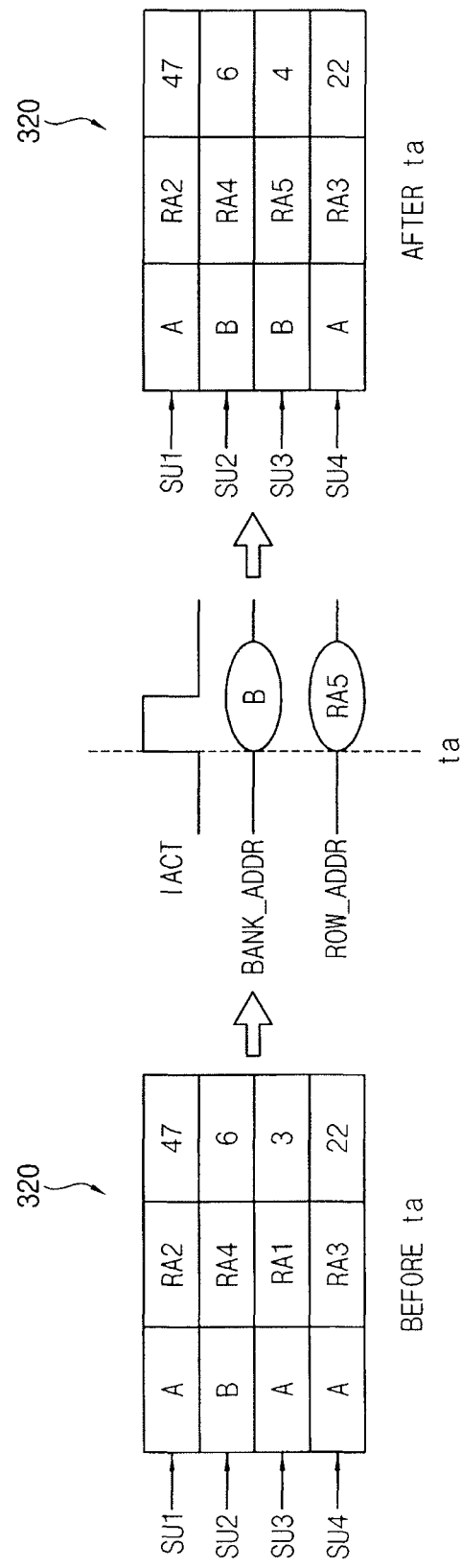

Referring to FIGS. 4, 8C and 8D, when a new input access address (B, RA5) is accessed while all of the storage units SU1, SU2, SU3 and SU4 are occupied by the access addressed, the storage controller in the hammer address manager 300 may store the new input access address (B, RA5) by replacing the stored access address (A, RA1) corresponding to a minimum access count value "3" among the access count values "47, 6, 3 and 22". It will be understood that "a minimum access count value" refers to a lowest access count value among the access count values stored in the access storage 320. In some example embodiments, as illustrated in FIG. 8C, the access count value "3" corresponding to the replaced access address (A, RA1) may be maintained and the access count value of the new access address (B, RA5) may be stored as "4". In some embodiments, as illustrated in FIG. 8D, the access count value "3" corresponding to the replaced access address (A, RA1) may be initialized to "0" and the access count value of the new access address (B, RA5) may be stored as "1".

Figure 9A:
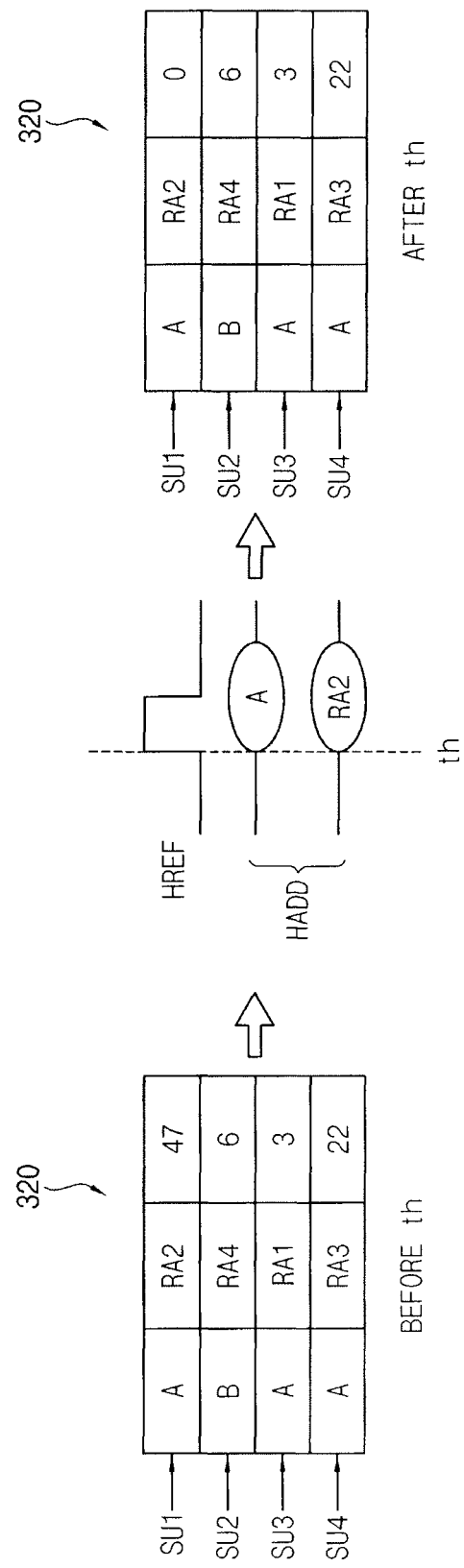
FIGS. 9A through 9C illustrate diagrams for describing example embodiments of determining a hammer address by the hammer address manager of FIG. 4.
Figure 9B:
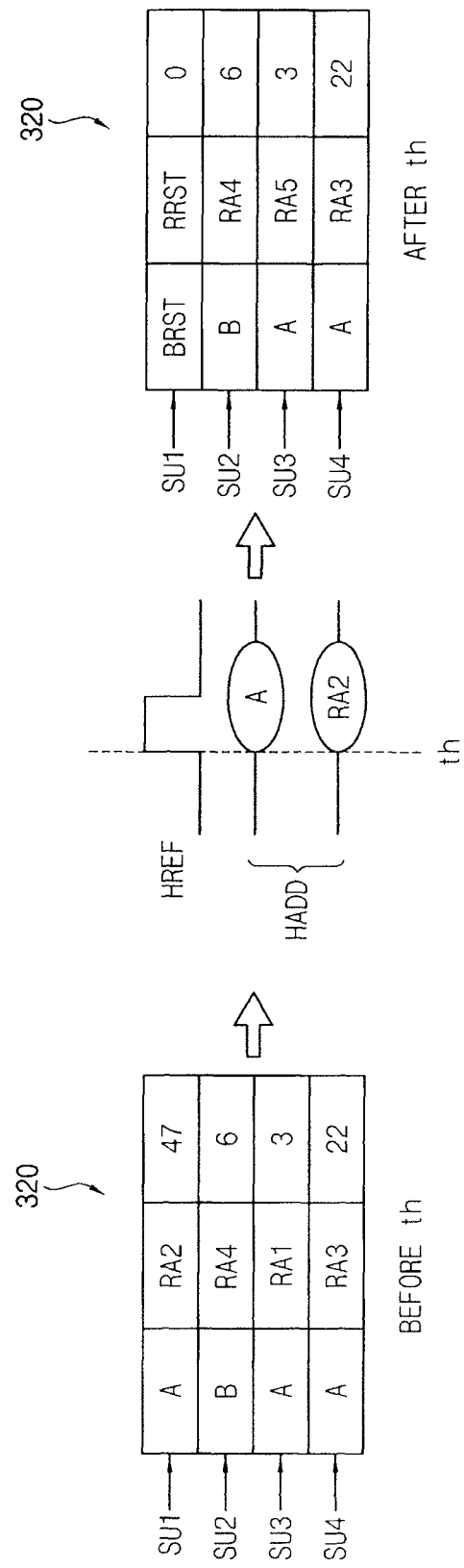
Figure 9C:
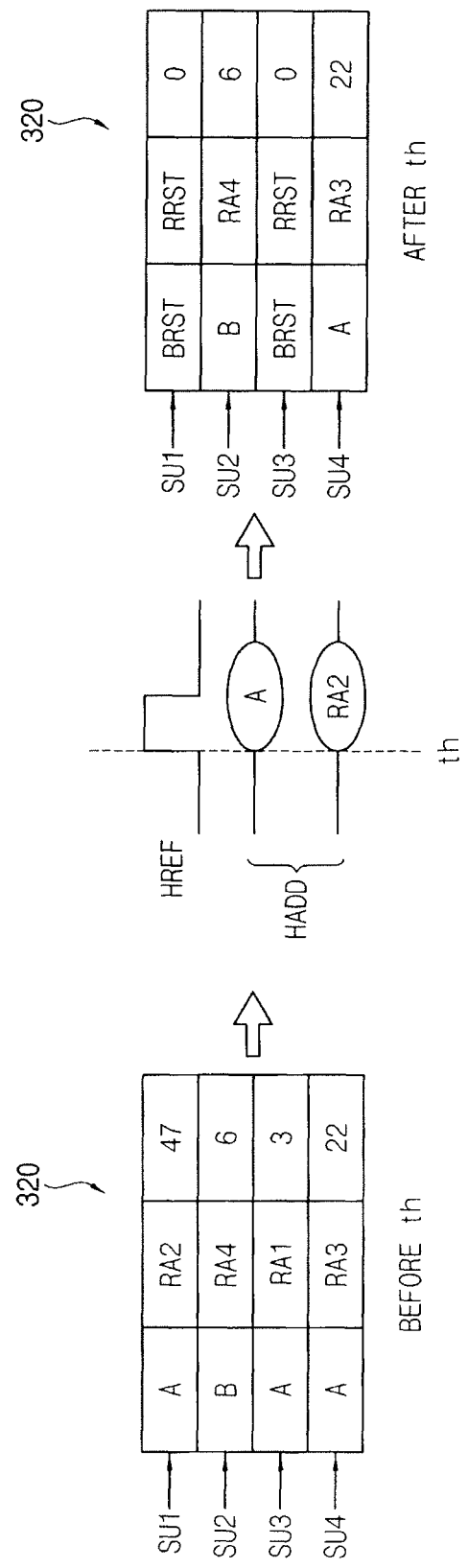

FIGS. 9A through 9C are diagrams for describing example embodiments of determining a hammer address by the hammer address manager of FIG. 4. Even though FIGS. 9A through 9C illustrate an example that the access storage 320 includes four storage units SU1, SU2, SU3, and SU4 for convenience of illustration and description, the number of the storage units may be changed variously. FIGS. 9A through 9C illustrate an access address that is determined as a hammer address HADD at an activation time point th of a hammer refresh signal HREF, and the states of the access storage 320 before and after the activation time point th of the hammer refresh signal HREF.

Referring to FIGS. 4, 9A, 9B, and 9C, the storage controller 340 in the hammer address manager 300 may determine the access address (A, RA2) as the hammer address HADD, among the stored access addresses (A, RA2), (B, RA4), (A,RA1) and (A, RA3), corresponding to a maximum access count value "47" among the access count values "47, 6, 3, 22" at the activation time point th of the hammer refresh signal HREF. It will be understood that "a maximum access count value" refers to a highest access count value among the access count values stored in the access storage 320. The storage controller 340 may not compare the access count value with a predetermined threshold value and may determine the hammer address HADD based on the maximum count value at the activation time point th of the hammer refresh signal HREF. Thus, rather than determining a hammer address based on an activation number or frequency greater than a predetermined threshold depending on the architecture of the memory device, the hammer address may be determined synthetically as the address among the access addresses that has been accessed most.

As illustrated in FIGS. 9A and 9B, the storage control block 340 may initialize the maximum access count value "47" to zero and maintain the other access count values "6, 3, 22" after determining the hammer address HADD to be the access address (A, RA2) corresponding to the maximum access count value "47". In some embodiments, the access address (A, RA2) corresponding to the maximum access count value "47" may be maintained in the access storage 320 as shown in FIG. 9A. In some embodiments, the access address (A, RA2) corresponding to the maximum access count value "47" may be initialized to the reset addresses BRST and RRST as shown in FIG. 9B.

As illustrated in FIG. 9C, in some embodiments, the storage controller 340 may initialize the maximum access count value "47" and a minimum access count value "3" among the access count values "47, 6, 3, 22" to zero and maintain the other access count values "6, 22" after determining the hammer address HADD to be the access address (A, RA2) corresponding to the maximum access count value "47". The access addresses (A, RA) and (A, RA1) corresponding to the initialized access count values "47, 3" may be maintained in the access storage 320 or may be initialized to the reset addresses BRST and RRST as shown in FIG. 9C.

FIG. 10 is a block diagram illustrating a memory device according to example embodiments. FIG. 10 is provided for describing example embodiments of synthetically managing access addresses with respect to a plurality of memory banks, and some elements in FIG. 3 are omitted in FIG. 10.

Referring to FIG. 10, a memory device 501 has a multi-bank structure that a memory cell array includes a plurality of memory banks 531, 532, 533, and 534. A refresh controller 101 according to example embodiments may include a timing controller 111, a refresh counter 121, and an address generator 130'. The address generator 130' may include a plurality of sub address generators 131, 132, 133, and 134.

The timing controller 111 may generate the counter refresh signal CREF and the hammer refresh signal HREF, which are activated selectively, based on the refresh signal IREF. The refresh counter 121 may generate the counter refresh address signal CRFADD in response to the counter refresh signal CREF such that the counter refresh address signal CRFADD represents a sequentially changing address. The sub address generators 131, 132, 133, and 134 may receive the hammer address HADD provided form the hammer address manager 300 and generate the hammer refresh address signals HRFADD1, HRFADD2, HRFADD3, and HRFADD4 corresponding to the memory banks 531, 532, 533, and 534, respectively. The counter refresh signal CREF, the hammer refresh signal HREF, and the counter refresh address signal CRFADD may be provided commonly to the memory banks 531, 532, 533, and 534, e.g., to corresponding row select circuits 541, 542, 543, and 544. In some example embodiments, as will be described below with reference to FIG. 16A, the hammer refresh address signals HRFADD1, HRFADD2, HRFADD3, and HRFADD4 provided to the memory banks 531, 532, 533 and 534 may be identical. In some example embodiments, as will be described below with reference to FIG. 16B, the hammer refresh address signals HRFADD1, HRFADD2, and HRFADD4 provided to the memory banks 531, 532, 533, and 534 may be determined independently.

Figure 11A:
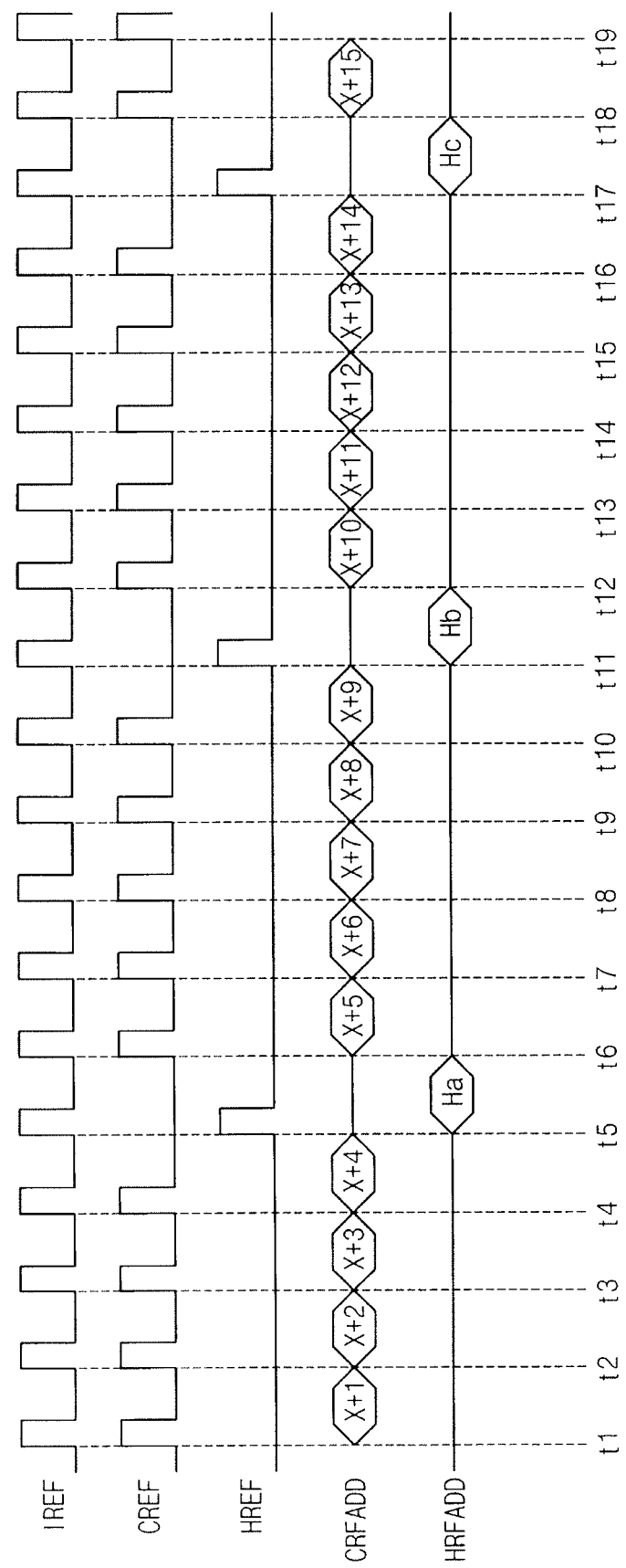
FIGS. 11A, 11B and 11C illustrate timing diagrams of example operations of a refresh controller included in the memory device of FIG. 10.
Figure 11B:
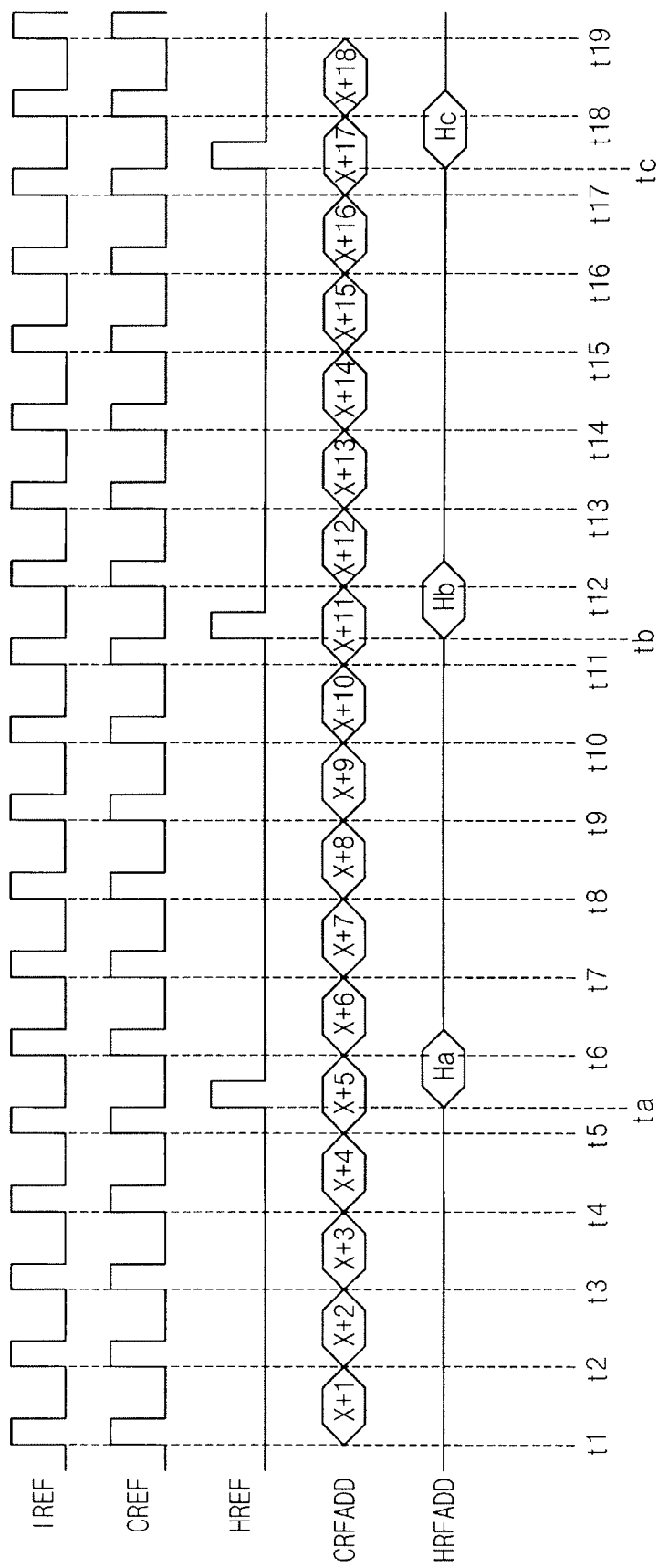
Figure 11C:
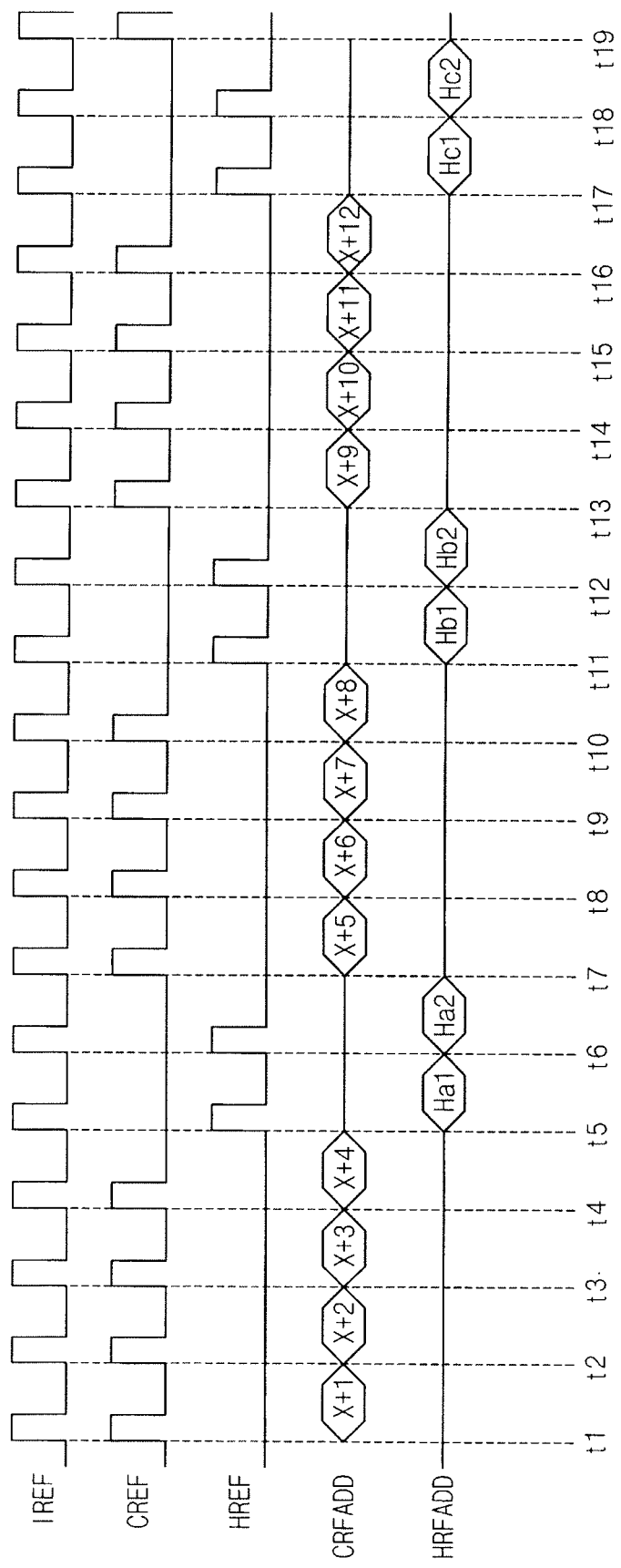

FIGS. 11A, 11B, and 11C are timing diagrams illustrating example operations of a refresh controller included in the memory device of FIG. 10. FIGS. 11A, 11B, and 11C illustrate generation of the counter refresh signal CREF, the hammer refresh signal HREF, the counter refresh address signal CRFADD and the hammer refresh address signal HRFADD, with respect to a refresh signal IREF that is activated with a pulse shape. The intervals between activation time points t1~t19 of the refresh signal IREF may be regular or irregular.

Referring to FIGS. 10 and 11A, the timing controller 111 may activate the counter refresh signal CREF in synchronization with time points t1~t4, t6~t10, t12~t16, and t~~t19 among the activation time points t1~t19 of the refresh signal IREF, and may activate the hammer refresh signal HREF in synchronization with the time points t5, t11 and t17. Even though FIG. 11A illustrates that the counter refresh signal CREF is activated five times for each activation of the hammer refresh signal HREF, the activation ratio of the counter refresh signal CREF and the hammer refresh signal HREF may be changed.

The refresh counter 121 may generate the counter refresh address signal CRFADD representing the sequentially changing addresses X+1~X+15 in synchronization with the activation time points t1~t4, t6~t10, t12~t16 and t18~t19 of the counter refresh signal CREF. The sub address generators 131~134 may generate the hammer refresh address signal HRFADD representing the address Ha, Hb, and Hc of the rows that are physically adjacent to the row of the hammer address HADD in synchronization with the activation time points t5, t11, and t17 of the hammer refresh signal HREF.

As illustrated in FIG. 11A, the sub address generators 131~134 may provide an address corresponding to one of the two adjacent rows. For example, the address Ha may be smaller than the hammer address HADD by 1 at the time point t5, and the address Hb may be larger than the hammer address HADD by 1 at the time point t11. As such, the sub address generator 131~134 may alternately provide the smaller address or the larger address with respect to the hammer address signal at each activation time point of the hammer refresh signal HREF.

Referring to FIGS. 10 and 11B, the timing controller 111 may activate the counter refresh signal CREF in synchronization with the activation time points t1~t19 of the refresh signal IREF, and activate the hammer refresh signal HREF in synchronization with the time points ta, tb, and tc while the refresh signal IREF is deactivated. Even though FIG. 11B illustrates that the counter refresh signal CREF is activated six times for each activation of the hammer refresh signal HREF, the activation ratio of the counter refresh signal CREF and the hammer refresh signal HREF may be changed.

The refresh counter 121 may generate the counter refresh address signal CRFADD representing the sequentially changing addresses X+1~X+18 in synchronization with the activation time points t1~t19 of the counter refresh signal CREF. The address generator 131~134 may generate the hammer refresh address signal HRFADD representing the address Ha, Hb, and He of the rows that are physically adjacent to the row of the hammer address HADD in synchronization with the activation time points ta, tb, and tc of the hammer refresh signal HREF.

As illustrated in FIG. 11B, the sub address generators 131~134 may provide an address corresponding to one of the two adjacent rows. For example, the address Ha may be smaller than the hammer address HADD by 1 at time point ta, and the address Hb may be larger than the hammer address HADD by 1 at time point tb. As such, the sub address generators 131~134 may alternately provide the smaller address or the larger address with respect to the hammer address signal HADD at each activation time point of the hammer refresh signal HREF.

Referring to FIGS. 10 and 11C, the timing controller 111 may activate the counter refresh signal CREF in synchronization with some the time points t1~t4, t7~t10, t13~t16, and t19 among the activation time points t1~t19 of the refresh signal IREF, and activate the hammer refresh signal HREF in synchronization with the time points t5, t6, t11, t12, t17 and t18. Even though FIG. 15C illustrates that the counter refresh signal CREF is activated four times for every two activations of the hammer refresh signal HREF, the activation ratio of the counter refresh signal CREF and the hammer refresh signal HREF may be changed.

The refresh counter 121 may generate the counter refresh address signal CRFADD representing the sequentially changing addresses X+1~X+12 in synchronization with the activation time points t1~t4, t7~t10, t13~t16 and t19 of the counter refresh signal CREF. The address generator 130' may generate the hammer refresh address signal HRFADD representing the address Ha1, Ha2, Hb1, Hb2, Hc1, and Hc2 of the rows that are physically adjacent to the row of the hammer address HADD in synchronization with the activation time points t5, t6, t11, t12, t17, and t18 of the hammer refresh signal HREF.

As illustrated in FIG. 11C, the sub address generator 131~134 may sequentially provide the addresses corresponding to the two adjacent rows. For example, the address Ha1 may be smaller than the hammer address HADD by 1 at time point t5, and the address Ha2 may be larger than the hammer address HADD by 1 at time point t6. As such, the mapper 450 may alternately provide the smaller address or the larger address with respect to the hammer address signal at each activation time point of the hammer refresh signal HREF.

Figure 12:
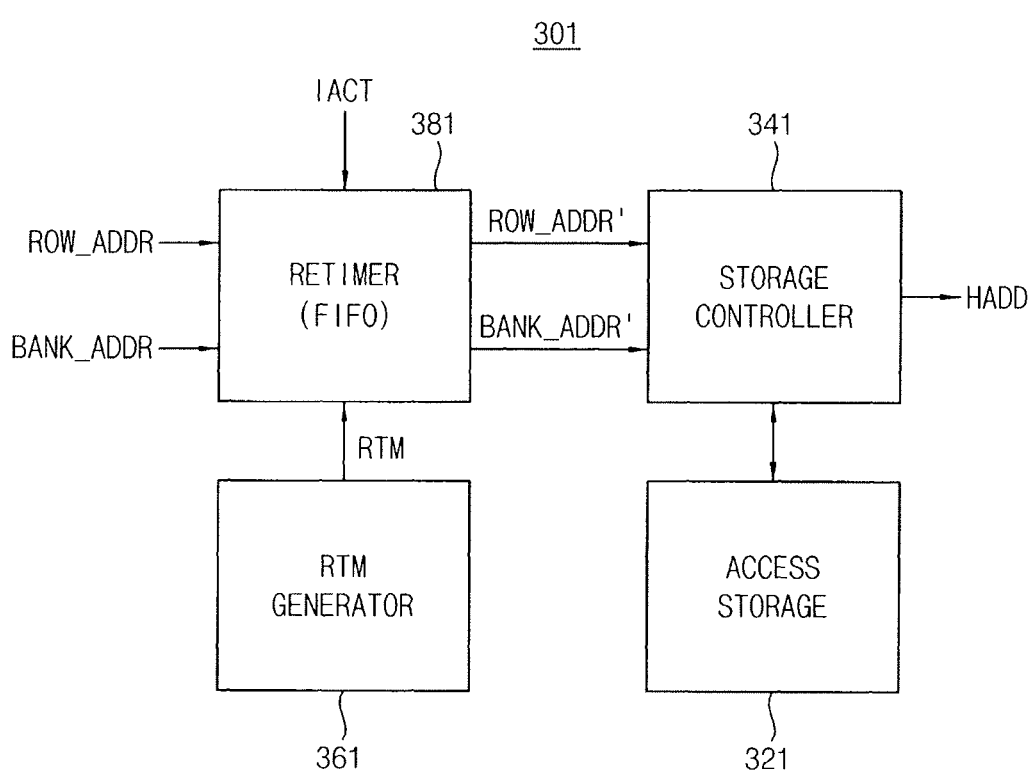
FIG. 12 illustrates a block diagram of a hammer address manager included in a memory device according to example embodiments.

FIG. 12 is a block diagram illustrating a hammer address manager included in a memory device according to example embodiments. Referring to FIG. 12, the hammer address manager 301 may include an access storage 321, a storage controller 341, a retiming signal generator 361, and a retimer 381. The access storage 321 and the storage controller 341 are substantially the same as described with reference to FIG. 4, and the repeated descriptions are omitted.

The retimer 381 may latch the access addresses included in the access address signal BANK_ADDR and ROW_ADDR and adjust output timings of the access address to provide retimed access address signal BANK_ADDR' and ROW_ADDR' to the storage controller 341. The retimer 381 may be implemented with a first-in first-out (FIFO) buffer. The retiming signal generator 361 may generate a retiming signal RTM representing output timings of the access addresses from the retimer 381.

The retimer 381 may latch the access addresses included in the access address signal BANK_ADDR and ROW_ADDR in response to an active signal IACT representing reception timings of active command provided from the memory controller. In addition, the retimer 381 may output the access addresses through the retimed access signal BANK_ADDR' and ROW_ADDR' to the storage controller 341 in response to the retiming signal RTM provided from the retiming signal generator 361.

Figure 13:
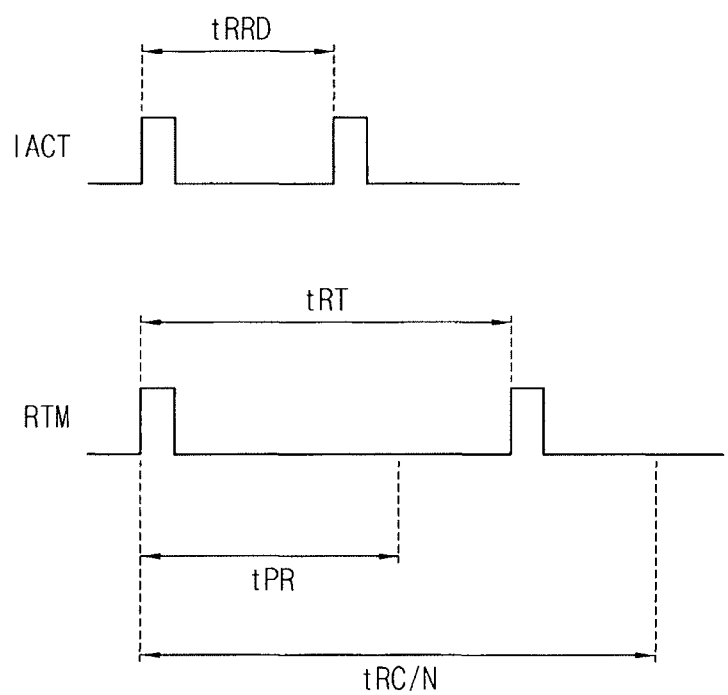
FIG. 13 illustrates a diagram for describing adjustment of output timings of a retimer included in the hammer address manager of FIG. 12.

FIG. 13 is a diagram for describing adjustment of output timings of a retimer included in the hammer address manager of FIG. 12. FIG. 13 illustrates an example of activation time intervals of an active signal IACT representing timings of receiving the access addresses by the retimer 381 and a retiming signal RTM representing timings of outputting the access addresses by the retimer 381. In FIG. 13, tRRD represents a row-to-row delay time corresponding to a minimum time interval between two successive active commands with respect to different memory banks, tRC represents a row active strobe (RAS) cycle time or row active time corresponding to a minimum time interval between two successive active commands with respect to the same memory bank, e.g., minimum number of clock cycles between a row active command and a precharge command, tRT represents an activation time interval of the retiming signal RTM, that is, an output time interval of the retimer 381, and tPR represents a time interval of processing one access address by the storage controller 341. For example, the row-to-row delay time tRRD may be several nanoseconds and the RAS cycle time tRC may be several tens nanoseconds.

As illustrated in FIG. 13, the activation time interval of the active signal IACT may be relatively short as the row-to-row delay time tRRD, in case of successive accesses with respect to the different memory banks. In this case, the processing time tPR of the storage controller 341 may be longer than the row-to-row delay time tRRD and thus the storage controller 341 cannot process the access addresses that are input successively. The retiming signal generator 361 may generate the retiming signal RTM that is activated with the activation time interval tRT longer than the processing time interval of the storage controller 341. The retimer 381 may output the access addresses in response to the retiming signal RTM. Thus, the retimer 381 may adjust the output timings of the access address such that the time interval tRT of outputting two successive access addresses is longer than the time interval tPR of processing one access address by the storage controller 341.

Figure 14A:
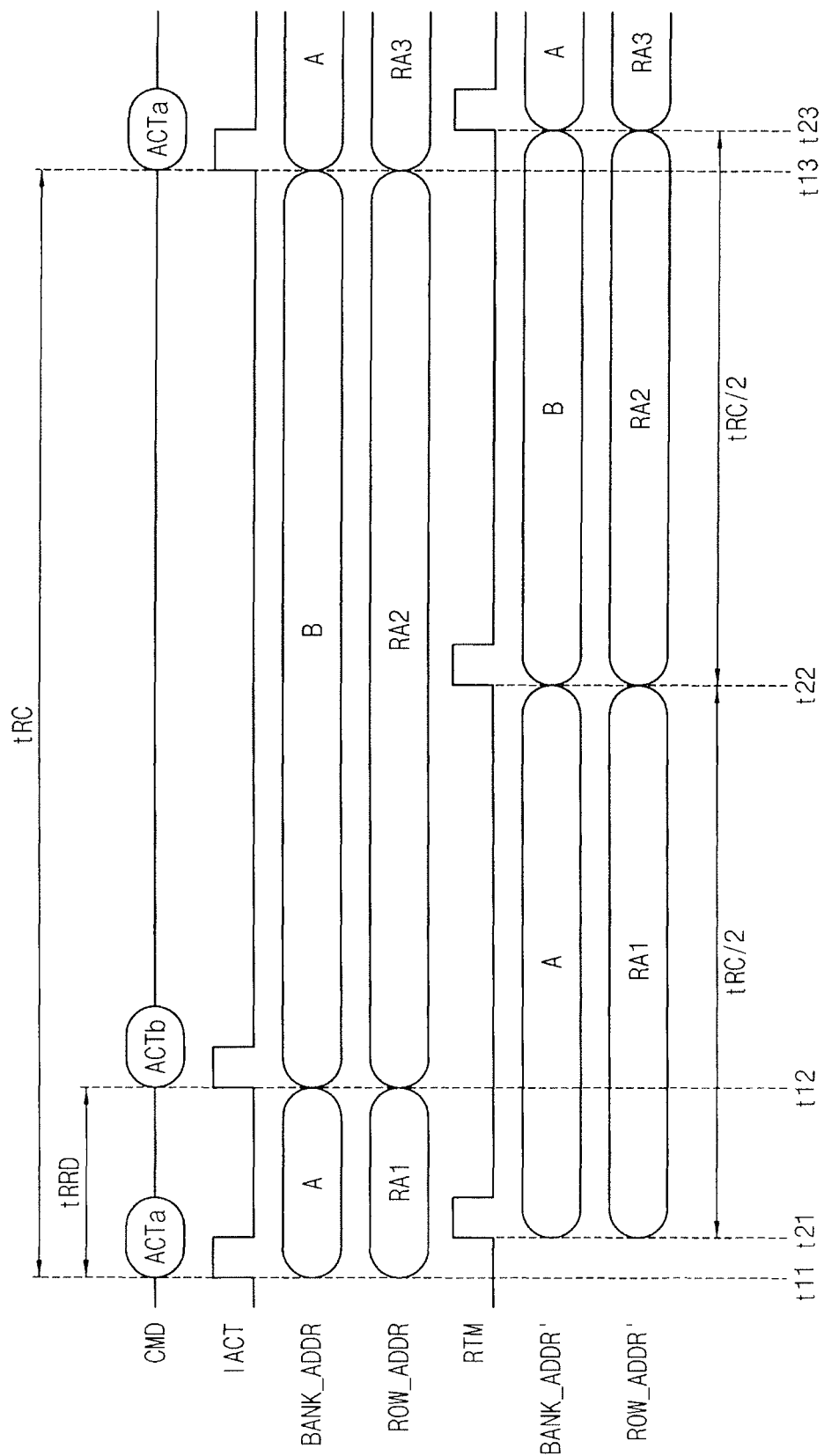
FIGS. 14A and 14B illustrate timing diagrams of example embodiments of an operation of a retimer included in the hammer address manager of FIG. 12.
Figure 14B:
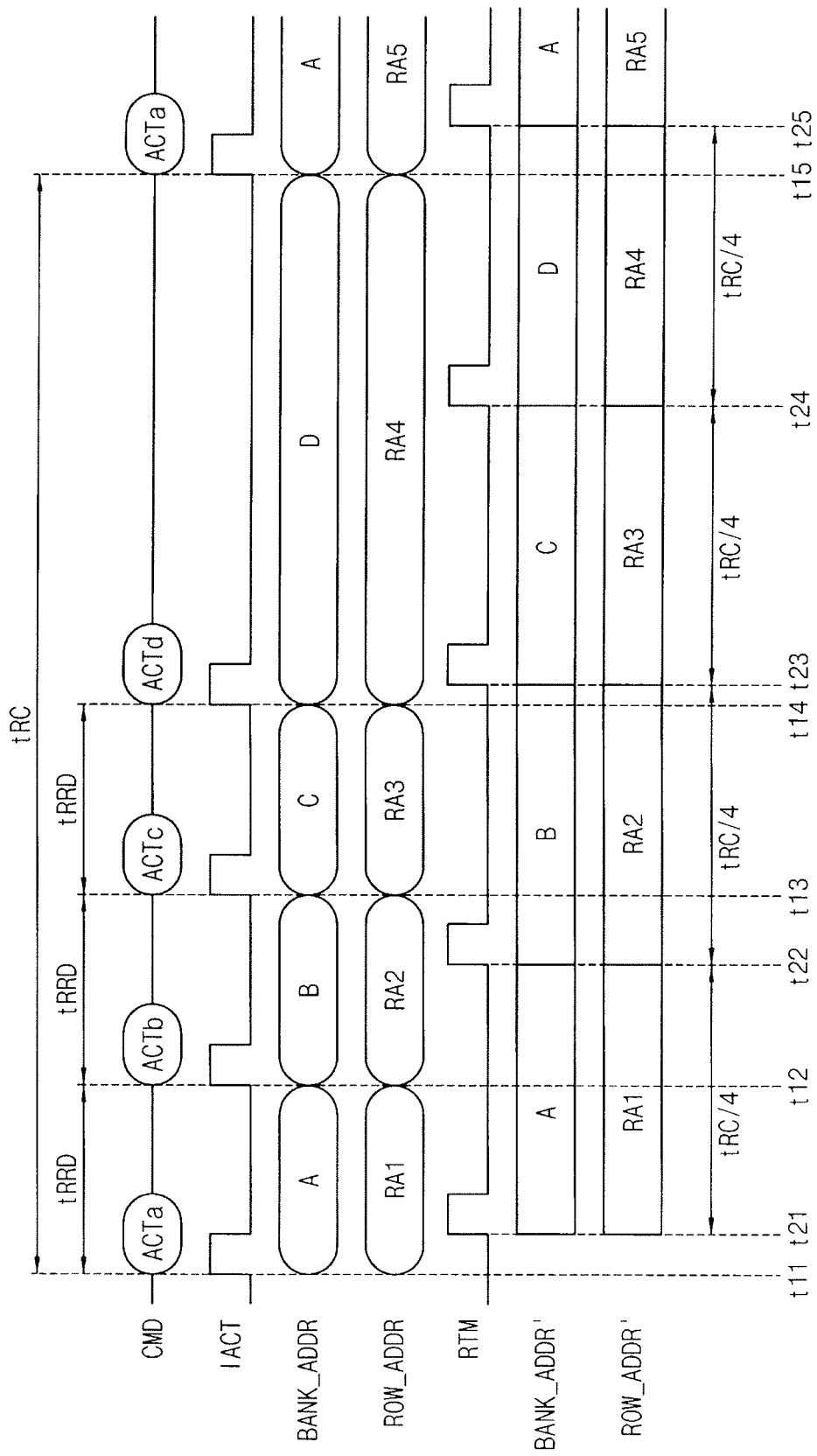

FIGS. 14A and 14B are timing diagrams illustrating example embodiments of an operation of a retimer included in the hammer address manager of FIG. 12. FIG. 14A illustrates an example embodiment in case that an access storage is shared by two memory banks A and B, and FIG. 14B illustrates an example embodiment in case that an access storage is shared by four memory banks A, B, C, and D.

Referring to FIGS. 12 and 14A, active commands ACTa and ACTb with respect to different memory banks A and B may be provided from a memory controller at time points t11, t12 and t13. The retimer 381 may latch access addresses (A, RA1), (B, RA2) and (A, RA3) included in the access address signal BANK_ADDR and ROW_ADDR in response to the active signal IACT representing reception timings of the active commands ACTa and ACTb.

The retiming signal generator 361 may generate the retiming signal RTM that is activated at time points t21, t22, and t23. In some example embodiments, the retiming signal generator 361 may activate the retiming signal RTM per a reference time interval tRC/2 corresponding to the RAS cycle time tRC divided by the number (e.g., 2) of the memory banks A and B sharing the access storage 321. The retimer 381 may, in response to the retiming signal RTM, output the access addresses (A, RA1), (B, RA2) and (A, RA3) through the retimed access signal BANK_ADDR' and ROW_ADDR' to the storage controller 341.

Referring to FIGS. 12 and 14B, active commands ACTa, ACTb, ACTc and ACTd with respect to different memory banks A, B, C and D may be provided from a memory controller at time points t11, t12, t13, t14, and t15. The retimer 381 may latch access addresses (A, RA1), (B, RA2), (C, RA3), (D, RA4) and (A, RA5) included in the access address signal BANK_ADDR and ROW_ADDR in response to the active signal IACT representing reception timings of the active commands ACTa, ACTb, ACTc, and ACTd.

The retiming signal generator 361 may generate the retiming signal RTM that is activated at time points t21, t22, t23, t24, and t25. In some example embodiments, the retiming signal generator 361 may activate the retiming signal RTM per a reference time interval tRC/4 corresponding to the RAS cycle time tRC divided by the number (e.g., 4) of the memory banks A, B, C and D sharing the access storage 321. The retimer 381 may, in response to the retiming signal RTM, output the access addresses (A, RA1), (B, RA2), (C, RA3), (D, RA4) and (A, RA5) through the retimed access signal BANK_ADDR' and ROW_ADDR' to the storage controller 341.

The example embodiments that the access storage is shared by the two memory banks or the four memory banks have been described with reference to FIGS. 14A and 14B, but example embodiments are not limited thereto. In other words, the retiming signal generator 361 may activate the retiming signal RTM per a reference time interval tRC/N corresponding to the RAD cycle time tRC divided by the number N of the memory banks sharing the access storage 321, where N is an arbitrary positive integer greater than one.

Figure 15:
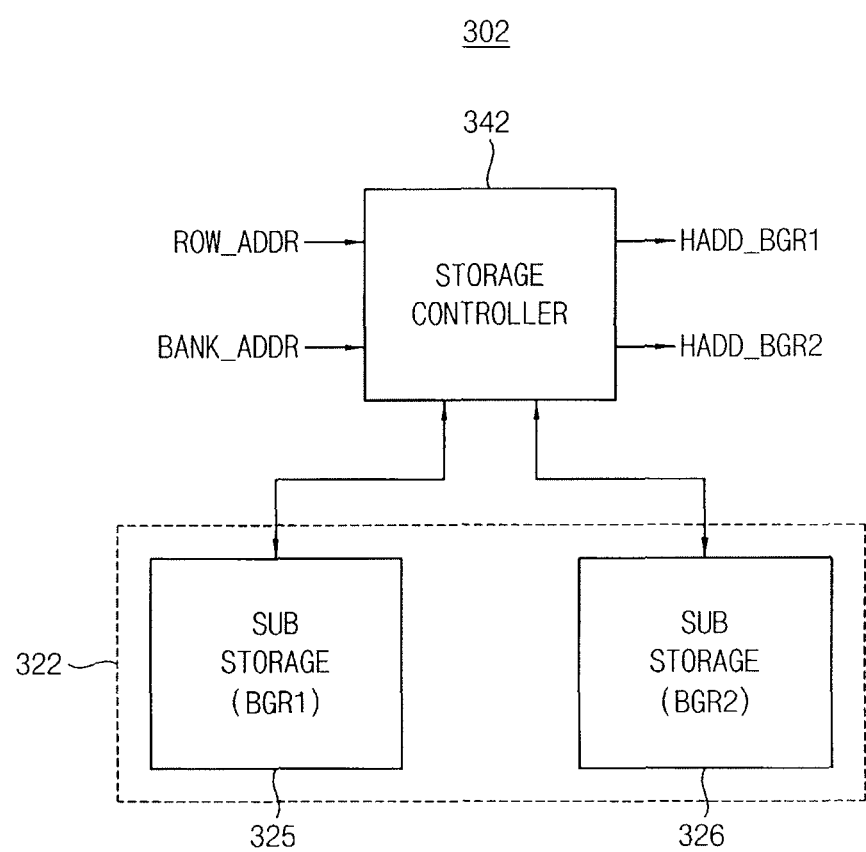
FIG. 15 illustrates a block diagram of a hammer address manager included in a memory device according to example embodiments.

FIG. 15 is a block diagram illustrating a hammer address manager included in a memory device according to example embodiments. Referring to FIG. 15, a hammer address manager 302 may include an access storage 322 and a storage controller 342.

The access storage 322 may store information with respect to the hammer address HADD that is accessed intensively or frequently. In some example embodiments, the access storage 322 may include a first sub storage 325 and a second sub storage 326. The first sub storage 325 may store the access addresses and the access count values with respect to a first bank group BGR1 including some memory banks among a plurality of memory banks included in a memory device. The second sub storage 326 may store the access addresses and the access count values with respect to a second bank group BGR2 including other memory banks among the plurality of memory banks. Even though FIG. 15 illustrates a configuration corresponding to the two bank groups BGR1 and BGR2 for convenience of illustration and description, a plurality of memory banks of a memory device may be grouped into three or more bank groups and the access storage may include three or more sub storages corresponding to the three or more bank groups.

Each of the sub storages 325 and 326 may include a plurality of storage units SU1~SUk to store the access addresses and the access count values as described with reference to FIG. 5. Each storage unit SUi (i=1~k) may include a bank register BREGi to store the bank address of each access address, a row register RREGi to store the row address of each access address and a count register CREGi to store each access count value.

The storage controller 342 may control the access storage 322 based on an access address signal BANK_ADDR and ROW_ADDR that is transferred from the memory controller 200 to the memory device 400. The access address may include a bank address signal BADD_ADDR and a row address signal ROW_ADDR. The storage controller 342 may determine and provide a first hammer address HADD_BGR1 for the hammer refresh operation of the first bank group BGR1 based on the access addresses and the access count values stored in the first sub storage 325. In addition, the storage controller 342 may determine and provide a second hammer address HADD_BGR2 for the hammer refresh operation of the second bank group BGR2 based on the access addresses and the access count values stored in the second sub storage 326.

Figure 16B:
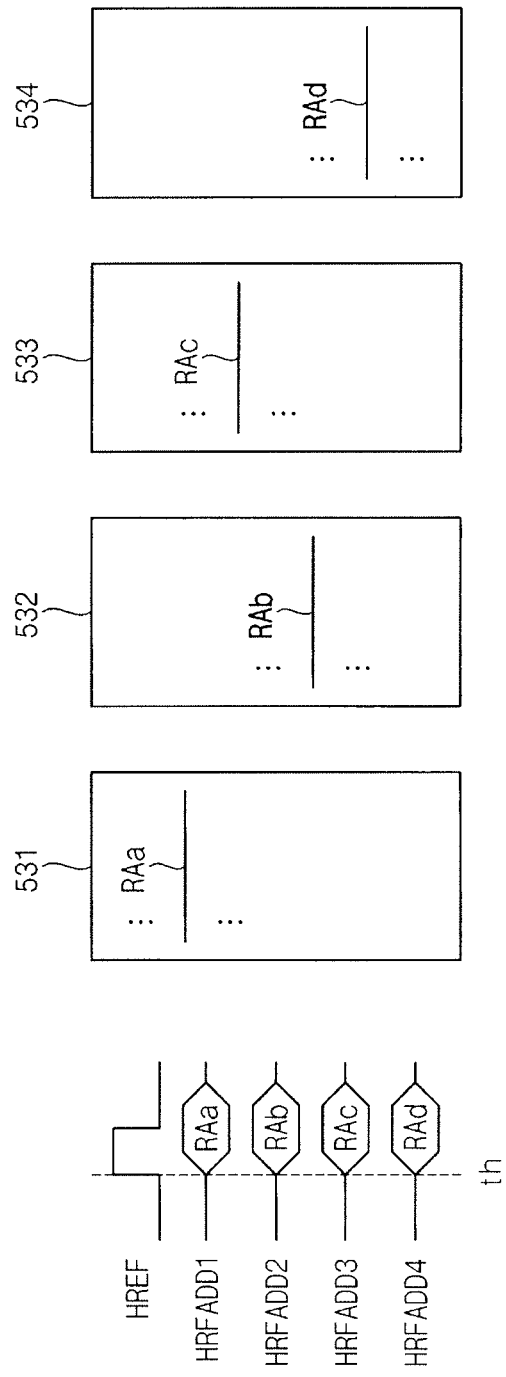

FIGS. 16A and 16B are diagrams for describing an operation of a memory device according to example embodiments.

Referring to FIGS. 10 and 16A, the hammer refresh address signal HRFADD representing a refresh address RAp may be provided commonly to the memory banks 531, 532, 533, and 534 at an activation time point th of the hammer refresh signal HREF. In other words, the memory cells included in rows having addresses corresponding to the hammer refresh address signal HRFADD may be refreshed simultaneously in all of the memory banks 531, 532, 533, and 534.

Referring to FIGS. 10 and 16B, the hammer refresh address signals HRFADD1, HRFADD2, HRFADD3 and HRFADD4 representing the refresh addresses RAa, RAb, Rac, and Rad, respectively, may be provided to the memory banks 531, 532, 533, and 534, respectively, at an activation time point th of the hammer refresh signal HREF. In other words, the memory cells included in rows having different refresh addresses RAa, RAb, Rac, and RAd in the respective memory banks 531, 532, 533 and 534 corresponding to the respective hammer refresh address signals HRFADD1, HRFADD2, HRFADD3, and HRFADD4 may be refreshed simultaneously.

Figure 17:
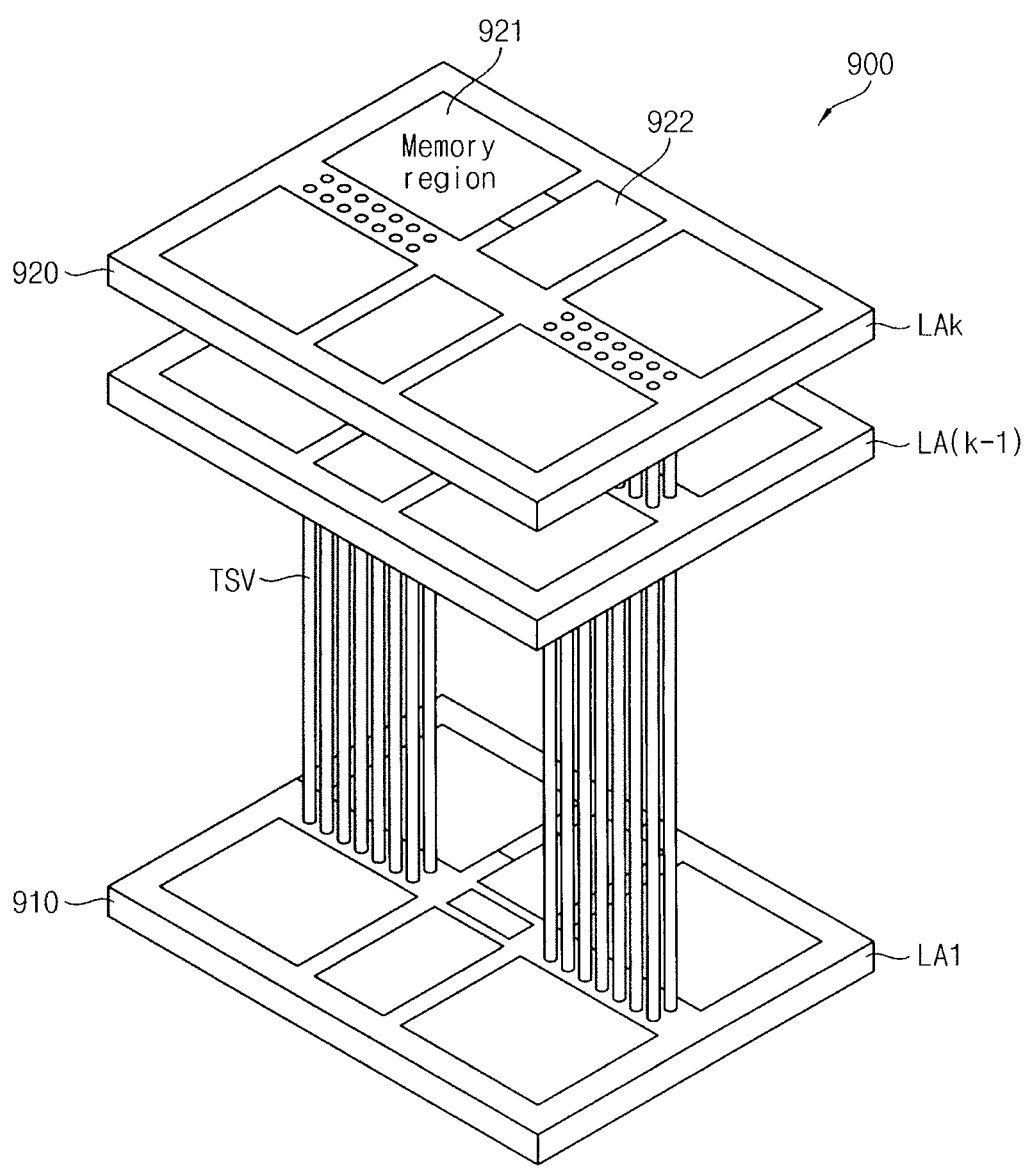
FIGS. 17 and 18 illustrate diagrams of a stacked memory device according to example embodiments.
Figure 18:
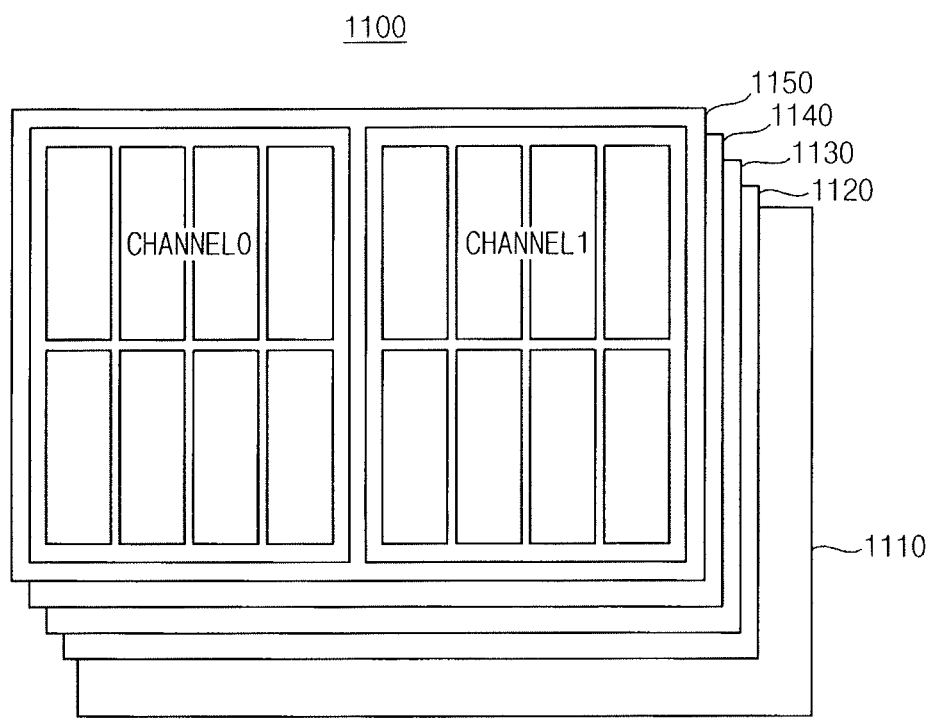

FIGS. 17 and 18 are diagrams illustrating a stacked memory device according to example embodiments.

Referring to FIG. 17, a semiconductor memory device 900 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer 910 through the kth semiconductor integrated circuit layer 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an outside source and buffering the address.

The first semiconductor integrated circuit layer 910 may further include a control circuit. The control circuit may control access to the memory region 921 based on a command and an address signal from a memory controller and may generate control signals for accessing the memory region 921.

Each of the semiconductor integrated circuit layers LA2 through LAk corresponding to the slave layer may include a refresh control circuit as described above. The refresh control circuit may include a hammer address manager for managing the access addresses synthetically with respect to a plurality of memory banks.

FIG. 18 illustrates an example high bandwidth memory (HBM) organization. Referring to FIG. 18, the HBM 1100 may have a stack of multiple DRAM semiconductor dies 1120, 1130, 1140, and 1150. The HBM of the stack structure may be optimized by a plurality of independent interfaces called channels. Each DRAM stack may support up to 8 channels in accordance with the HBM standards. FIG. 18 shows an example stack containing 4 DRAM semiconductor dies 1120, 1130, 1140, and 1150 and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some function for the DRAM semiconductor dies 1120, 1130, 1140, and 1150 may be implemented in the interface die 1110.

Each of the DRAM semiconductor dies 1120, 1130, 1140, and 1150 may include a refresh control circuit as described above. The refresh control circuit may include a hammer address manager for managing the access addresses synthetically with respect to a plurality of memory banks.

Figure 19:
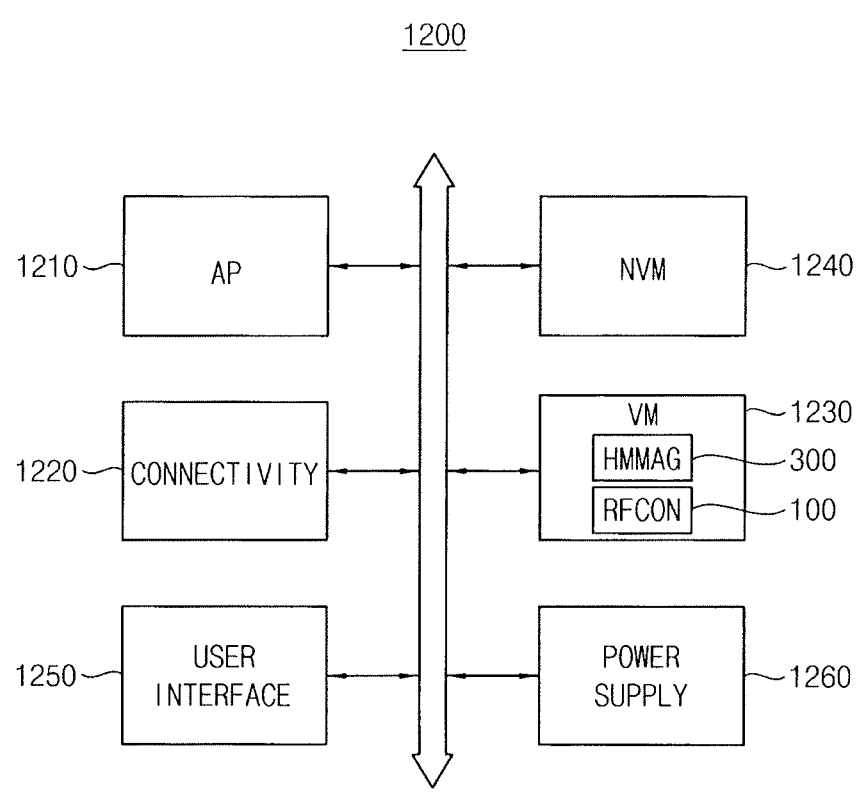
FIG. 19 illustrates a block diagram of a mobile system according to example embodiments.

FIG. 19 is a block diagram illustrating a mobile system according to example embodiments. Referring to FIG. 19, a mobile system 1200 includes an application processor (AP) 1210, a connectivity unit 1220, a volatile memory device (VM) 1230, a nonvolatile memory device (NVM) 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

As described above, the memory device may include a refresh controller RFCON 100 and a hammer address manager HMMAG 300. The hammer address manager 300 may manage access addresses synthetically with respect to the plurality of memory banks and provide a hammer address for a hammer refresh operation among the access addresses, where the hammer address is an address that is accessed intensively. The refresh controller 100 may generate a hammer refresh address signal based on the hammer address, where the hammer refresh address signal represents a row that is physically adjacent to a row corresponding to the hammer address. According to example embodiments, the hammer address manager 300 may be included in the memory controller of the application processor 1210 and the refresh controller 100 may be included in the memory device 1230.

One or more embodiments may provide a refresh control circuit, a memory device, and a method of operating a memory device according to example embodiments that decreases an occupation area of resources for the hammer refresh operation and enhances efficiency of the hammer refresh operation by managing the access addresses synthetically with respect to the plurality of memory banks using the access storage shared by the plurality of memory banks.

Embodiments herein may be applied to any memory device requiring a refresh operation and systems including the memory device. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

Some example embodiments may provide a refresh control circuit and a memory device including a refresh control circuit capable of efficiently performing a hammer refresh operation.

Embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device comprising:
    a plurality of memory banks;
    a hammer address manager to manage access addresses with respect to the plurality of memory banks, and to provide a hammer address for a hammer refresh operation among the access addresses, the hammer address being the access address that is accessed more than other access addresses, wherein the hammer address manager includes a storage controller and a retimer, the retimer to adjust output timings of access addresses that are provided to the storage controller; and
    a refresh controller to generate a hammer refresh address signal based on the hammer address, the hammer refresh address signal representing a row physically adjacent to a row corresponding to the hammer address such that the row physically adjacent to the row corresponding to the hammer address is refreshed by the hammer refresh operation.

2. The memory device as claimed in claim 1, wherein the hammer address manager includes:
    an access storage to store the access addresses with respect to the plurality of memory banks, the access storage being shared by the plurality of memory banks.

3. The memory device as claimed in claim 1, wherein each of the access addresses corresponds to a combination of a bank address and a row address.

4. The memory device as claimed in claim 3, wherein:
    the hammer address manager includes an access storage to store the access addresses and to store access count values, each access count value representing an access number of each access address, and
    the storage controller is to control the access storage based on an access address signal provided from a memory controller, and to provide the hammer address among the access addresses based on the access addresses and the access count values stored in the access storage.

5. The memory device as claimed in claim 4, wherein the access storage includes:
    a plurality of storage units, each storage unit including:
        a bank register to store the bank address of each access address;
        a row register to store the row address of each access address; and
        a count register to store each access count value.

6. The memory device as claimed in claim 4, wherein the access storage includes:
    a first sub storage to store the access addresses and the access count values with respect to a first bank group including some memory banks among the plurality of memory banks; and
    a second sub storage to store the access addresses and the access count values with respect to a second bank group including other memory banks among the plurality of memory banks.

7. The memory device as claimed in claim 4, wherein the retimer is configured to latch the access addresses included in the access address signal.

8. The memory device as claimed in claim 7, wherein the retimer adjusts the output timings of the access addresses such that a time interval of outputting two successive access addresses is longer than a time interval of processing one access address by the storage controller.

9. The memory device as claimed in claim 8, wherein the retimer adjusts the output timings of the access address such that the time interval of outputting two successive access addresses is shorter than a reference time interval corresponding to a row address strobe ("RAS") cycle time divided by a number of the memory banks sharing the access storage, the RAS cycle time representing a minimum time interval between two successive active commands with respect to a same memory bank.

10. The memory device as claimed in claim 7, wherein the retimer is a first-in, first-out buffer.

11. The memory device as claimed in claim 7, wherein the retimer latches the access addresses included in the access address signal in response to an active signal representing reception timings of active command provided from the memory controller.

12. The memory device as claimed in claim 7, wherein the retimer outputs the access addresses to the storage controller in response to a retiming signal that is activated by an output time interval longer than a time interval of processing one access address by the storage controller.

13. The memory device as claimed in claim 7, wherein the hammer address manager further includes:
 a retiming signal generator that generates a retiming signal representing output timings of the access addresses from the retimer.

14. The memory device as claimed in claim 13, wherein the retiming signal generator activates the retiming signal by a reference time interval corresponding to a RAS cycle time divided by a number of the memory banks sharing the access storage, the RAS cycle time representing a minimum time interval between two successive active commands with respect to a same memory bank.

15. The memory device as claimed in claim 1, wherein the refresh controller includes:
 a timing controller to, based on operational characteristics of the memory device, generate a hammer refresh signal representing timings of the hammer refresh operation; and
 an address generator to generate the hammer refresh address signal based on the hammer refresh signal and the hammer address.

16. The memory device as claimed in claim 15, wherein memory cells of a same row corresponding to the hammer refresh address signal included in the plurality of memory banks are refreshed simultaneously at an activation time point of the hammer refresh signal.

17. The memory device as claimed in claim 15, wherein the address generator includes:
 a plurality of sub address generators to generate a plurality of hammer refresh address signals respectively corresponding to the plurality of memory banks, and
 wherein memory cells of different rows corresponding to the plurality of hammer refresh address signals respectively included in the plurality of memory banks are refreshed simultaneously at an activation time point of the hammer refresh signal.

18. The memory device as claimed in claim 1, wherein the memory device is a three-dimensional semiconductor memory device in which a plurality of semiconductor dies are stacked in a vertical direction.

19. A refresh control circuit, comprising:
 an access storage to store access addresses with respect to a plurality of memory banks included in a memory device and to store access count values, each access count value representing an access number of each access address, the access storage being shared by the plurality of memory banks;
 a storage controller to control the access storage based on an access address signal provided from a memory controller, and to provide a hammer address for a hammer refresh operation among the access addresses based on the access addresses and the access count values stored in the access storage, the hammer address being the access address that is accessed more than other access addresses;
 a retimer to adjust output timings of access addresses, included in the access address signal, that are provided to the storage controller; and
 a refresh controller to generate a hammer refresh address signal based on the hammer address, the hammer refresh address signal representing a row physically adjacent to a row corresponding to the hammer address such that the row physically adjacent to the row corresponding to the hammer address is refreshed by the hammer refresh operation.

20. A method of operating a memory device, comprising:
 managing access addresses with respect to a plurality of memory banks using an access storage that is shared by the plurality of memory banks;
 controlling the access storage based on an access address signal provided from a memory controller;
 adjusting output timings of access addresses that are included in the access address signal:
 providing a hammer address for a hammer refresh operation among the access addresses having adjusted output timings, the hammer address being the access address that is accessed more than other access addresses; and
 generating a hammer refresh address signal based on the hammer address, the hammer refresh address signal representing a row that is physically adjacent to a row corresponding to the hammer address such that the row physically adjacent to the row corresponding to the hammer address is refreshed by the hammer refresh operation.

* * * * *